United States Patent
Swahn et al.

(10) Patent No.: US 9,655,292 B2
(45) Date of Patent: May 16, 2017

(54) METHODS OF MAKING PHOTOVOLTAIC ARRAYS AND RAIL SYSTEMS

(71) Applicant: Alion Energy, Inc., Richmond, CA (US)

(72) Inventors: Anders Swahn, Tiburon, CA (US); Wolfgang Oels, Dortmund (DE)

(73) Assignee: Alion Energy, Inc., Richmond, CA (US)

( * ) Notice: Subject to any disclaimer, the term of this patent is extended or adjusted under 35 U.S.C. 154(b) by 371 days.

(21) Appl. No.: 14/050,237

(22) Filed: Oct. 9, 2013

(65) Prior Publication Data

US 2014/0033511 A1 Feb. 6, 2014

Related U.S. Application Data

(62) Division of application No. 13/091,960, filed on Apr. 21, 2011.

(Continued)

(51) Int. Cl.
*B21C 23/00* (2006.01)
*H05K 13/00* (2006.01)
(Continued)

(52) U.S. Cl.
CPC ............. *H05K 13/00* (2013.01); *B21C 23/00* (2013.01); *B25J 5/007* (2013.01); *F24J 2/5237* (2013.01);
(Continued)

(58) Field of Classification Search
CPC ......... H05K 13/00; H02S 40/36; H02S 20/10; H02S 20/00; B21C 23/00; B25J 5/007; F24J 2/5239; F24J 2/5237; F24J 2002/5281; F24J 2002/4687; Y10T 29/49002; Y02E 10/47; Y02E 10/50
See application file for complete search history.

(56) References Cited

U.S. PATENT DOCUMENTS 3,267,824 A * 8/1966 Hudis ................. E01C 19/4866
404/100
3,334,217 A 8/1967 Bickler et al.
(Continued)

FOREIGN PATENT DOCUMENTS

CN 101858659 10/2010
CN 202019322 10/2011
(Continued)

OTHER PUBLICATIONS

Patent Cooperation Treaty, International Search Report for PCT/US11/027700 mailed May 3, 2011 (2 pages).
(Continued)

*Primary Examiner* — Ryan J Walters
(74) *Attorney, Agent, or Firm* — Jones Day

(57) ABSTRACT

Rail system and method for a photovoltaic array. The system includes at least one modular rail in a first direction. The modular rail includes a first vehicle support surface along the first direction and a first mounting surface along the first direction. The first vehicle support surface is configured to support at least a first vehicle moving in the first direction, and the first mounting surface is configured to support one or more photovoltaic modules mounted on the first mounting surface.

13 Claims, 18 Drawing Sheets

Related U.S. Application Data

(60) Provisional application No. 61/328,575, filed on Apr. 27, 2010.

(51) Int. Cl.
  *F24J 2/52* (2006.01)
  *B25J 5/00* (2006.01)
  *H02S 20/00* (2014.01)
  *H02S 20/10* (2014.01)
  *H02S 40/36* (2014.01)
  *H02S 40/34* (2014.01)
  *F24J 2/46* (2006.01)

(52) U.S. Cl.
  CPC .............. *F24J 2/5239* (2013.01); *H02S 20/00* (2013.01); *H02S 20/10* (2014.12); *H02S 40/34* (2014.12); *H02S 40/36* (2014.12); *F24J 2002/4687* (2013.01); *F24J 2002/5281* (2013.01); *Y02E 10/47* (2013.01); *Y02E 10/50* (2013.01); *Y10T 29/49002* (2015.01)

(56) References Cited

U.S. PATENT DOCUMENTS

| | | |
|---|---|---|
| 3,516,340 A * | 6/1970 | Perkins .................... E01C 19/43 404/75 |
| 3,540,360 A * | 11/1970 | Swisher, Jr. ......... B62D 55/065 172/23 |
| 3,951,506 A | 4/1976 | Bennett et al. |
| 4,145,021 A | 3/1979 | Gaechter et al. |
| 4,219,926 A | 9/1980 | Bloch et al. |
| 4,279,347 A | 7/1981 | Appleman et al. |
| 4,290,416 A | 9/1981 | Maloney et al. |
| 4,296,270 A | 10/1981 | Kohler et al. |
| 4,301,322 A | 11/1981 | Amick et al. |
| 4,301,409 A | 11/1981 | Miller et al. |
| 4,371,139 A | 2/1983 | Clark |
| 4,421,943 A | 12/1983 | Withjack et al. |
| 4,422,614 A | 12/1983 | Santos |
| 4,496,063 A | 1/1985 | Ishii et al. |
| 4,664,270 A | 5/1987 | Voelz |
| 4,667,834 A | 5/1987 | Lanigan et al. |
| 4,676,713 A | 6/1987 | Voelpel |
| 4,706,825 A | 11/1987 | Johnson |
| 4,876,143 A | 10/1989 | Sugita et al. |
| 4,877,365 A | 10/1989 | Lanigan, Jr. et al. |
| 4,880,346 A | 11/1989 | Brassette et al. |
| 4,995,377 A | 2/1991 | Eiden et al. |
| 5,125,608 A | 6/1992 | McMaster et al. |
| 5,143,556 A | 9/1992 | Matlin |
| 5,152,109 A | 10/1992 | Boers |
| D335,541 S | 5/1993 | Rosario-Cartagena |
| 5,228,924 A | 7/1993 | Barker et al. |
| 5,232,519 A | 8/1993 | Glatfelter et al. |
| 5,257,891 A | 11/1993 | Baumann et al. |
| 5,361,704 A | 11/1994 | Bounds |
| 5,460,660 A | 10/1995 | Albright et al. |
| 5,501,744 A | 3/1996 | Albright et al. |
| 5,505,788 A | 4/1996 | Dinwoodie |
| 5,568,713 A | 10/1996 | Gagne et al. |
| 5,593,901 A | 1/1997 | Oswald et al. |
| 5,715,958 A | 2/1998 | Feider et al. |
| 5,800,631 A | 9/1998 | Yamada et al. |
| 5,816,769 A | 10/1998 | Bauer et al. |
| 5,826,734 A | 10/1998 | Baumann et al. |
| 6,037,578 A | 3/2000 | Grandjean et al. |
| 6,046,399 A | 4/2000 | Kapner |
| 6,058,930 A | 5/2000 | Shingleton |
| 6,111,189 A | 8/2000 | Garvison et al. |
| 6,201,181 B1 | 3/2001 | Azzam et al. |
| 6,233,502 B1 | 5/2001 | Yim |
| 6,495,750 B1 | 12/2002 | Dinwoodie |
| 6,590,363 B2 | 7/2003 | Teramoto |
| 6,639,421 B1 | 10/2003 | Yoshino et al. |
| 6,722,357 B2 | 4/2004 | Shingleton |
| 6,730,841 B2 | 5/2004 | Heckeroth |
| 6,809,251 B2 | 10/2004 | Dinwoodie |
| 7,086,675 B2 | 8/2006 | Jacobs |
| 7,252,083 B2 | 8/2007 | Hayden |
| 7,309,850 B2 | 12/2007 | Sinton et al. |
| 7,374,137 B2 | 5/2008 | Staney |
| 7,411,408 B2 | 8/2008 | Shimotomai et al. |
| 7,476,832 B2 | 1/2009 | Vendig et al. |
| 7,492,120 B2 | 2/2009 | Benn et al. |
| 7,531,741 B1 | 5/2009 | Melton et al. |
| 7,546,929 B2 | 6/2009 | Wierzba et al. |
| 7,712,807 B2 | 5/2010 | Perlman et al. |
| 7,799,987 B1 | 9/2010 | Hines et al. |
| 7,814,899 B1 | 10/2010 | Port |
| 7,888,588 B2 | 2/2011 | Shingleton |
| 7,898,212 B2 | 3/2011 | Benn et al. |
| 7,963,578 B2 | 6/2011 | Wells et al. |
| 8,006,624 B2 | 8/2011 | Sin |
| 8,203,237 B1 | 6/2012 | Cowles |
| 8,245,459 B2 | 8/2012 | Belikoff et al. |
| 8,371,076 B2 | 2/2013 | Jones et al. |
| 8,407,950 B2 | 4/2013 | Hartelius |
| 8,464,496 B2 | 6/2013 | Cusson et al. |
| 8,492,645 B1 | 7/2013 | Strahm |
| 8,500,918 B1 | 8/2013 | Meller et al. |
| 8,550,419 B2 | 10/2013 | Hausner et al. |
| 8,573,545 B2 | 11/2013 | Walquist et al. |
| 8,578,928 B2 | 11/2013 | Lumbreras |
| 8,607,512 B2 | 12/2013 | Batut |
| 8,609,977 B2 | 12/2013 | Jones et al. |
| 8,635,818 B2 | 1/2014 | Wildes |
| 8,657,991 B2 | 2/2014 | Potter et al. |
| 8,752,343 B2 | 6/2014 | Kuan et al. |
| 8,962,972 B2 | 2/2015 | Sagayama |
| 9,192,966 B2 | 11/2015 | Zanatta |
| 9,355,873 B2 | 5/2016 | Eitellhuber |
| 2003/0075211 A1 | 4/2003 | Makita et al. |
| 2004/0250491 A1 | 12/2004 | Diaz et al. |
| 2005/0061360 A1 | 3/2005 | Horioka et al. |
| 2005/0268959 A1 | 12/2005 | Aschenbrenner et al. |
| 2006/0054162 A1 | 3/2006 | Romeo |
| 2006/0174931 A1 | 8/2006 | Mapes et al. |
| 2006/0290344 A1 | 12/2006 | Shimotomai et al. |
| 2007/0012352 A1 | 1/2007 | Wohlgemuth et al. |
| 2007/0215145 A1 | 9/2007 | Hayden |
| 2007/0283996 A1 | 12/2007 | Hachtmann et al. |
| 2008/0010915 A1 | 1/2008 | Liebendorfer |
| 2008/0023069 A1 | 1/2008 | Terada et al. |
| 2008/0040990 A1 | 2/2008 | Vendig et al. |
| 2008/0053517 A1 | 3/2008 | Plaisted et al. |
| 2008/0087320 A1 | 4/2008 | Mapes et al. |
| 2008/0099063 A1 | 5/2008 | Armstrong et al. |
| 2008/0121273 A1 | 5/2008 | Plaisted et al. |
| 2008/0135084 A1 | 6/2008 | Scharlack |
| 2008/0156365 A1 | 7/2008 | Scholz et al. |
| 2008/0233429 A1 | 9/2008 | Oguma et al. |
| 2008/0271774 A1 | 11/2008 | Kalkanoglu et al. |
| 2008/0306700 A1 | 12/2008 | Kawam et al. |
| 2009/0014057 A1 | 1/2009 | Croft et al. |
| 2009/0032100 A1 | 2/2009 | Oak |
| 2009/0114261 A1 | 5/2009 | Stancel et al. |
| 2009/0139557 A1 | 6/2009 | Rose et al. |
| 2009/0173831 A1 | 7/2009 | Roseman |
| 2009/0191030 A1 | 7/2009 | Bluck et al. |
| 2009/0205270 A1 | 8/2009 | Shaw et al. |
| 2009/0223142 A1 | 9/2009 | Shingleton et al. |
| 2009/0260671 A1 | 10/2009 | Green et al. |
| 2009/0282755 A1 | 11/2009 | Abbott et al. |
| 2009/0293932 A1 | 12/2009 | Augenbraun et al. |
| 2009/0293941 A1 | 12/2009 | Luch |
| 2009/0308430 A1 | 12/2009 | Everett et al. |
| 2010/0031996 A1 | 2/2010 | Basol |
| 2010/0043781 A1 | 2/2010 | Jones et al. |
| 2010/0108118 A1 | 5/2010 | Luch |
| 2010/0127142 A1 | 5/2010 | Genschorek |
| 2010/0147286 A1 | 6/2010 | Xiang et al. |
| 2010/0175337 A1 | 7/2010 | Mascolo et al. |
| 2010/0175738 A1 | 7/2010 | Huss et al. |

(56) References Cited

U.S. PATENT DOCUMENTS

| | | |
|---|---|---|
| 2010/0206294 A1 | 8/2010 | Blair et al. |
| 2010/0236183 A1 | 9/2010 | Cusson et al. |
| 2010/0252092 A1 | 10/2010 | Lenox et al. |
| 2010/0269429 A1 | 10/2010 | Belikoff et al. |
| 2010/0269888 A1 | 10/2010 | Johnston, Jr. |
| 2010/0269891 A1 | 10/2010 | Kinard et al. |
| 2010/0275975 A1 | 11/2010 | Monschke et al. |
| 2010/0281791 A1 | 11/2010 | Intagliata et al. |
| 2010/0319277 A1 | 12/2010 | Suarez et al. |
| 2010/0325797 A1 | 12/2010 | Home |
| 2011/0126378 A1 | 6/2011 | Ota |
| 2011/0126884 A1 | 6/2011 | Dritsas |
| 2011/0162691 A1 | 7/2011 | Hartelius |
| 2011/0173900 A1 | 7/2011 | Plaisted et al. |
| 2011/0183540 A1 | 7/2011 | Keenihan et al. |
| 2011/0194900 A1 | 8/2011 | French |
| 2011/0264306 A1 | 10/2011 | Bagge |
| 2011/0284057 A1 | 11/2011 | Swahn et al. |
| 2011/0309215 A1 | 12/2011 | Lu et al. |
| 2012/0027550 A1 | 2/2012 | Bellacicco et al. |
| 2012/0034799 A1 | 2/2012 | Hunt |
| 2012/0037214 A1 | 2/2012 | Sagayama |
| 2012/0056638 A1 | 3/2012 | Swahn |
| 2012/0067738 A1 | 3/2012 | Field |
| 2012/0090176 A1 | 4/2012 | Stancel et al. |
| 2012/0131866 A1 | 5/2012 | Batut |
| 2012/0132246 A1 | 5/2012 | Hunt et al. |
| 2012/0132262 A1 | 5/2012 | Sagayama |
| 2012/0152233 A1 | 6/2012 | Masuda et al. |
| 2012/0198682 A1 | 8/2012 | Potter et al. |
| 2012/0198779 A1 | 8/2012 | Tachino |
| 2012/0199266 A1 | 8/2012 | Potter et al. |
| 2012/0223033 A1 | 9/2012 | Molek |
| 2012/0298201 A1 | 11/2012 | Stephan |
| 2013/0068275 A1 | 3/2013 | Swahn et al. |
| 2013/0133172 A1 | 5/2013 | Kiener et al. |
| 2013/0139869 A1 | 6/2013 | Nuernberger et al. |
| 2013/0180568 A1 | 7/2013 | Hartelius |
| 2013/0206206 A1 | 8/2013 | Bjorneklett et al. |
| 2013/0248478 A1 | 9/2013 | Wheeler et al. |
| 2013/0263914 A1 | 10/2013 | Crimmins et al. |
| 2013/0305518 A1 | 11/2013 | Adriani et al. |
| 2013/0319962 A1 | 12/2013 | Park et al. |
| 2013/0340807 A1 | 12/2013 | Gerwing et al. |
| 2014/0069483 A1 | 3/2014 | Wolter et al. |
| 2015/0069001 A1 | 3/2015 | French et al. |
| 2015/0144156 A1 | 5/2015 | French et al. |
| 2015/0200619 A1 | 7/2015 | Worden |
| 2015/0316639 A1 | 11/2015 | Russ et al. |
| 2015/0330040 A1 | 11/2015 | Dobbs |
| 2016/0044843 A1 | 2/2016 | Swahn et al. |

FOREIGN PATENT DOCUMENTS

| | | |
|---|---|---|
| CN | 203055930 | 7/2013 |
| DE | 102009049926 | 4/2011 |
| EA | 200970984 | 6/2010 |
| EP | 2505934 | 10/2012 |
| FR | 2959555 | 11/2011 |
| WO | WO 2006/117551 | 9/2006 |
| WO | WO 2010/054274 | 5/2010 |
| WO | WO 2010/136468 | 12/2010 |
| WO | WO 2010/145844 | 12/2010 |
| WO | WO 2012/003585 | 1/2012 |
| WO | WO 2012/107671 | 8/2012 |

OTHER PUBLICATIONS

Patent Cooperation Treaty, Written Opinion of the International Searching Authority for PCT/US11/027700 mailed May 3, 2011 (4 pages).
Patent Cooperation Treaty, International Search Report for PCT/US11/033722 mailed Jul. 28, 2011 (2 pages).
Patent Cooperation Treaty, Written Opinion of the International Searching Authority for PCT/US11/033722 mailed Jul. 28, 2011 (9 pages).
Patent Cooperation Treaty, International Search Report for PCT/US11/038094 mailed Sep. 2, 2011 (2 pages).
Patent Cooperation Treaty, Written Opinion of the International Searching Authority for PCT/US11/038094 mailed Sep. 2, 2011 (12 pages).
Patent Cooperation Treaty, International Search Report for PCT/US11/046175 mailed Dec. 9, 2011 (2 pages).
Patent Cooperation Treaty, Written Opinion of the International Searching Authority for PCT/US11/046175 mailed Dec. 9, 2011 (8 pages).
Patent Cooperation Treaty, International Search Report for PCT/US12/029345 mailed Oct. 10, 2012 (4 pages).
Patent Cooperation Treaty, Written Opinion of the International Searching Authority for PCT/US12/029345 mailed Oct. 10, 2012 (8 pages).
Patent Cooperation Treaty, International Search Report for PCT/US13/30416 mailed Jun. 17, 2013 (2 pages).
Patent Cooperation Treaty, Written Opinion of the International Searching Authority for PCT/US13/30416 mailed Jun. 17, 2013 (6 pages).
Patent Cooperation Treaty, International Search Report for PCT/US13/40500 mailed Sep. 4, 2013 (2 pages).
Patent Cooperation Treaty, Written Opinion of the International Searching Authority for PCT/US13/40500 mailed Sep. 4, 2013 (9 pages).
United States Patent and Trademark Office, Non final office action dated Nov. 8, 2012 for U.S. Appl. No. 13/043,286 (14 pages).
United States Patent and Trademark Office, Non final office action dated Jan. 10, 2014 for U.S. Appl. No. 13/091,960 (21 pages).
United States Patent and Trademark Office, Non final office action dated Sep. 6, 2013 for U.S. Appl. No. 13/195,562 (15 pages).
United States Patent and Trademark Office, Non final office action dated Mar. 24, 2014 for U.S. Appl. No. 13/195,562 (24 pages).
United States Patent and Trademark Office, Non final office action dated Aug. 8, 2013 for U.S. Appl. No. 13/421,740 (9 pages).
United States Patent and Trademark Office, Final office action dated Mar. 24, 2014 for U.S. Appl. No. 13/421,740 (12 pages).
United States Patent and Trademark Office, Final office action dated Aug. 26, 2015 for U.S. Appl. No. 13/091,960 (24 pages).
United States Patent and Trademark Office, Final office action dated Oct. 7, 2014 for U.S. Appl. No. 13/195,562 (17 pages).
United States Patent and Trademark Office, Non final office action dated Sep. 24, 2014 for U.S. Appl. No. 13/421,740 (15 pages).
United States Patent and Trademark Office, Non final office action dated Nov. 19, 2014 for U.S. Appl. No. 13/091,960 (26 pages).
Patent Cooperation Treaty, International Search Report for PCT/US14/54916 mailed Dec. 24, 2014 (2 pages).
Patent Cooperation Treaty, International Search Report for PCT/US14/53787 mailed Jan. 12, 2015 (2 pages).
Patent Cooperation Treaty, Written Opinion of the International Searching Authority for PCT/US14/54916 mailed Dec. 24, 2014 (9 pages).
Patent Cooperation Treaty, Written Opinion of the International Searching Authority for PCT/US14/53787 mailed Jan. 12, 2015 (7 pages).
Chinese Patent Office, First Office Action for CN 201280023942.0, mailed Mar. 20, 2015.
European Patent Office, Extended European Search Report for EP 12760313.2-1605 mailed Mar. 25, 2015 (6 pages).
United States Patent and Trademark Office, Non final office action dated May 7, 2015 for U.S. Appl. No. 13/195,562 (17 pages).
United States Patent and Trademark Office, Non final office action dated Mar. 25, 2015 for U.S. Appl. No. 13/794,217 (16 pages).
Chinese Patent Office, Second Office Action for CN 201280023942.0, mailed Feb. 14, 2016, for which no English language translation has been located.
Chinese Patent Office, First Office Action for CN 201380035248.5, mailed Oct. 20, 2015, with English Translation.
United States Patent and Trademark Office, Non-final office action dated Jan. 12, 2016 for U.S. Appl. No. 13/091,960 (22 pages).

(56) References Cited

OTHER PUBLICATIONS

United States Patent and Trademark Office, Notice of allowance dated Nov. 23, 2015 for U.S. Appl. No. 13/195,562 (17 pages).
United States Patent and Trademark Office, Notice of allowance dated Mar. 1, 2016 for U.S. Appl. No. 13/195,562 (15 pages).
United States Patent and Trademark Office, Final office action dated Nov. 20, 2015 for U.S. Appl. No. 13/421,740 (16 pages).
United States Patent and Trademark Office, Non final office action dated Mar. 2, 2016 for U.S. Appl. No. 13/421,740 (17 pages).
United States Patent and Trademark Office, Notice of Allowance dated Nov. 3, 2015 for U.S. Appl. No. 13/794,217 (5 pages).
United States Patent and Trademark Office, Non final office action dated Dec. 7, 2015 for U.S. Appl. No. 14/481,678 (7 pages).
Australian Patent Office, Patent Examination Report No. 1 for Application 2013263123, mailed Jun. 30, 2016 (4 pages).
Kazakhstan Patent Office, Official Action for Application 2014/2546.1, date stamped Jul. 22, 2016.
Patent Office of the Cooperation Counsel of the Arab States of the Gulf, Examination Report for GC 2012-22216, mailed Mar. 7, 2016 (5 pages).
Patent Cooperation Treaty, International Search Report for PCT/US2016/032459 mailed Sep. 8, 2016 (4 pages).
Patent Cooperation Treaty, Written Opinion of the International Searching Authority for PCT/US2016/032459 mailed Sep. 8, 2016 (7 pages).
Patent Cooperation Treaty, International Search Report for PCT/US2016/032464 mailed Oct. 4, 2016 (4 pages).
Patent Cooperation Treaty, Written Opinion of the International Searching Authority for PCT/US2016/032464 mailed Oct. 4, 2016 (7 pages).
United States Patent and Trademark Office, Notice of Allowance dated Sep. 29, 2016 for U.S. Appl. No. 13/421,740 (8 pages).
United States Patent and Trademark Office, Notice of Allowance dated Mar. 28, 2016 for U.S. Appl. No. 13/794,217 (6 pages).
United States Patent and Trademark Office, Office Action dated Jul. 12, 2016 for U.S. Appl. No. 13/892,140 (12 pages).
United States Patent and Trademark Office, Notice of Allowance dated Jun. 14, 2016 for U.S. Appl. No. 13/091,960 (9 pages).
United States Patent and Trademark Office, Notice of Allowance dated Jun. 7, 2016 for U.S. Appl. No. 14/481,678 (5 pages).
Youtube, "Soluzioni per lavaggio e pulizia fotovoltaico / Solar panel cleaning solutions / Lavaggio pannelli," 3:22 minute video uploaded to *YouTube* by Wash Panel, published on May 3, 2013, https//www.youtube.com/watch?v=b6duSZHIC9o , 7 pages (screen shots obtained on Aug. 11, 2016).

\* cited by examiner

METHODS OF MAKING PHOTOVOLTAIC ARRAYS AND RAIL SYSTEMS

1. CROSS-REFERENCES TO RELATED APPLICATIONS

This application is a divisional of U.S. application Ser. No. 13/091,960, filed Apr. 21, 2011, which claims priority to U.S. Provisional No. 61/328,575, filed Apr. 27, 2010, both applications being commonly assigned and incorporated by reference herein for all purposes.

Additionally, this application is related to U.S. patent application Ser. No. 13/043,286, commonly assigned, incorporated by reference herein for all purposes.

2. BACKGROUND OF THE INVENTION

The present invention is directed to utility arrays. More particularly, the invention provides systems and methods for installation and operation of photovoltaic arrays. Merely by way of example, the invention has been applied to solar farms. But it would be recognized that the invention has a much broader range of applicability.

Photovoltaics convert sunlight into electricity, providing a desirable source of clean energy. FIG. 1 is a simplified diagram of a conventional photovoltaic array. The photovoltaic array 100 includes strings 1, 2, 3, 4, . . . n, where n is a positive integer larger than or equal to 1. Each string includes photovoltaic (PV) modules (e.g., solar panels) that are connected in series. The photovoltaic array 100 is connected to a central inverter 110, which provides an alternating current (AC) connection to a power grid 120. FIG. 2 is a simplified diagram of a conventional photovoltaic module. The photovoltaic (PV) module 210 includes a junction box 220 on the backside of the PV module 210.

The installation of photovoltaic arrays often presents logistical challenges. Not only does the site for the photovoltaic array need to be properly prepared, but large quantities of materials also need to be transported to and within the site. For example, the site for the photovoltaic array may have existing vegetation that would interfere with the installation and operation of the photovoltaic array. This vegetation usually has to be cleared. The site may also have uneven terrain that usually requires extensive grading and earth moving. Once the site is prepared, it is then often necessary to build an extensive infrastructure on which the strings of PV modules 210 are to be affixed. The PV modules 210 are then moved into position, affixed to the structure, and interconnected so that power can be delivered to the power grid 120. Each of these operations can be time-consuming and expensive.

Once the photovoltaic array is in operation, additional infrastructure often is used to support, maintain, evaluate, and repair the array. In order to support the operation of the photovoltaic array, equipment and materials routinely need to be transported from one end of the array to another. For example, the test equipment is transported to a PV module that is under evaluation. In another example, the cleaning equipment is transported to remove debris and dirt from the PV module. In yet another example, an additional module is transported as replacement for the defective module. Depending upon the terrain, soils, and weather, simply getting equipment and materials from one end of the array to another often poses significant challenges, especially if the ground is muddy. As with the installation, these operational needs can also be time-consuming and expensive.

Hence, it is highly desirable to improve techniques for installation and operation of photovoltaic arrays.

3. BRIEF SUMMARY OF THE INVENTION

The present invention is directed to utility arrays. More particularly, the invention provides systems and methods for installation and operation of photovoltaic arrays. Merely by way of example, the invention has been applied to solar farms. But it would be recognized that the invention has a much broader range of applicability.

According to one embodiment, a rail system for a photovoltaic array includes at least one modular rail in a first direction. The modular rail includes a first vehicle support surface along the first direction and a first mounting surface along the first direction. The first vehicle support surface is configured to support at least a first vehicle moving in the first direction, and the first mounting surface is configured to support one or more photovoltaic modules mounted on the first mounting surface.

For example, the modular rail further includes a plenum along the first direction, the plenum being configured to hold one or more cables. In another example, the modular rail further includes a cover for the plenum. In yet another example, the modular rail further includes one or more notches at one or more intervals respectively along the modular rail, and the one or more notches are substantially perpendicular to the first direction. In yet another example, the modular rail further includes a base surface opposite to the first mounting surface, and the first mounting surface is tilted relative to the base surface. In yet another example, the modular rail further includes a base surface opposite to the first mounting surface. The base surface forms one or more channels at one or more intervals along the modular rail, and the one or more channels are substantially perpendicular to the first direction. In yet another example, the modular rail further includes a second mounting surface along the first direction, and the second mounting surface is substantially coplanar with the first mounting surface. In yet another example, the modular rail further includes one or more indicia at one or more intervals respectively along the modular rail, and the one or more indicia are configured to identify one or more locations in the rail system.

In yet another example, the rail system further includes a first photovoltaic module affixed to the first mounting surface with at least one or more mechanical connectors. In yet another example, the rail system further includes a first photovoltaic module affixed to the first mounting surface with at least one or more adhesive materials. In yet another example, the first photovoltaic module is affixed to the first mounting surface using at least a flexible spacer with at least the one or more adhesive materials. In yet another example, the rail system further includes a second photovoltaic module coupled to the first photovoltaic module through at least an interconnector. In yet another example, the interconnector is selected from a group consisting of a rigid in-line slide-on interconnector, a flexible slide-in interconnector, a flexible ribbon interconnector, and an in-line slide-in edge interconnector.

In yet another example, the rail system further includes the first vehicle configured to perform one or more first tasks. In yet another example, each of the one or more first tasks is associated with at least installation, operation, logistics, or servicing of a photovoltaic array. In yet another example, the first vehicle is further configured to perform the one or more first tasks automatically. In yet another example, the first vehicle includes at least a power supply selected from a group consisting of a battery, a photovoltaic module, and a combustion engine. In yet another example, the first vehicle includes at least a sensor configured to determine a location of the first vehicle. In yet another example, the modular rail includes one or more indicia at one or more intervals respectively along the modular rail, the one or more indicia are configured to identify one or more locations in the rail system, and the sensor is further configured to determine the location using the one or more indicia. In yet another example, the first vehicle includes at least a communication system to communicate with a second vehicle, the second vehicle being configured to perform one or more second tasks. In yet another example, the second vehicle is further configured to transport the first vehicle.

In yet another example, the rail system further includes at least one index rail in a second direction. The index rail includes a second vehicle support surface along the second direction, and the second vehicle support surface is configured to support at least a second vehicle moving in the second direction. In yet another example, the second vehicle support surface is further configured to support at least the first vehicle moving in the second direction. In yet another example, the index rail further includes a plenum along the second direction, the plenum being configured to hold one or more cables. In yet another example, the index rail further includes a cover for the plenum. In yet another example, the index rail further includes one or more notches at one or more intervals respectively along the index rail, and the one or more notches are substantially perpendicular to the second direction. In yet another example, the index rail further includes a base surface forming one or more channels at one or more intervals along the index rail, and the one or more channels being substantially perpendicular to the second direction. In yet another example, the first direction and the second direction are substantially perpendicular.

According to another embodiment, a method for making a photovoltaic rail includes grading an installation site, and extruding at least one photovoltaic rail associated with a substantially uniform profile along its length. The process for extruding at least one photovoltaic rail includes making at least a vehicle support surface along the photovoltaic rail.

For example, the method further includes placing a reinforcing mesh on the installation site before the process for extruding at least one photovoltaic rail is performed. In another example, the process for extruding at least one photovoltaic rail further includes making at least a mounting surface along the photovoltaic rail. In yet another example, the process for extruding at least one photovoltaic rail further includes making at least a plenum along the photovoltaic rail. In yet another example, the method further includes covering the plenum of the photovoltaic rail. In yet another example, the method further includes making one or more notches at one or more intervals respectively along the photovoltaic rail, and the one or more notches are substantially perpendicular to the modular rail. In yet another example, the photovoltaic rail is a modular rail or an index rail.

According to yet another embodiment, a method for installing a photovoltaic array includes forming at least one modular rail in a first direction. The modular rail includes a first vehicle support surface along the first direction and a mounting surface along the first direction. Additionally, the method includes affixing at least a first photovoltaic module and a second photovoltaic module to the mounting surface, and interconnecting the first photovoltaic module to the second photovoltaic module. The process for affixing at least a first photovoltaic module and a second photovoltaic module to the mounting surface includes moving a first vehicle along the first vehicle support surface, and the first vehicle includes at least one robotic arm. Additionally, the process for affixing at least a first photovoltaic module and a second photovoltaic module to the mounting surface includes affixing the first photovoltaic module and the second photovoltaic module to the mounting surface by at least the robotic arm. For example, the method further includes forming at least one index rail in a second direction, and the index rail includes a second vehicle support surface along the index rail. In another example, the method further includes loading a first vehicle onto a second vehicle, and moving the second vehicle carrying the first vehicle. In yet another example, the process for affixing at least a first photovoltaic module and a second photovoltaic module to the mounting surface is performed with at least one or more adhesive materials. In yet another example, the process for affixing at least a first photovoltaic module and a second photovoltaic module to the mounting surface is performed with at least one or more mechanical connectors.

The present invention provides advantages over conventional technology. Certain embodiments of the present invention provide a photovoltaic array based on at least one or more modular rails that enable partial or full automation of many installation and operational tasks. Some embodiments of the present invention can reduce time and cost of installation and operation of a photovoltaic array. For example, the maintenance and operation cost of the photovoltaic array is significantly reduced. In another example, the servicing of the photovoltaic array (e.g., diagnostics, cleaning, and/or snow removal) is significantly improved. Certain embodiments of the present invention provide one or more vehicles that can move along one or more modular rails and/or one or more index rails to navigate throughout the photovoltaic array and perform various tasks. Some embodiments of the present invention provide a photovoltaic array that does not need panel-to-panel cable strain relief. Certain embodiments of the present invention provide an installation method and system that eliminates expensive junction boxes and standardized cable interconnects of conventional PV modules. Some embodiments of the present invention can improve wind tolerance of a photovoltaic array.

Depending upon the embodiment, one or more of these benefits may be achieved. These benefits and various additional objects, features, and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to utility arrays. More particularly, the invention provides systems and methods for installation and operation of photovoltaic arrays. Merely by way of example, the invention has been applied to solar farms. But it would be recognized that the invention has a much broader range of applicability.

Figure 1:
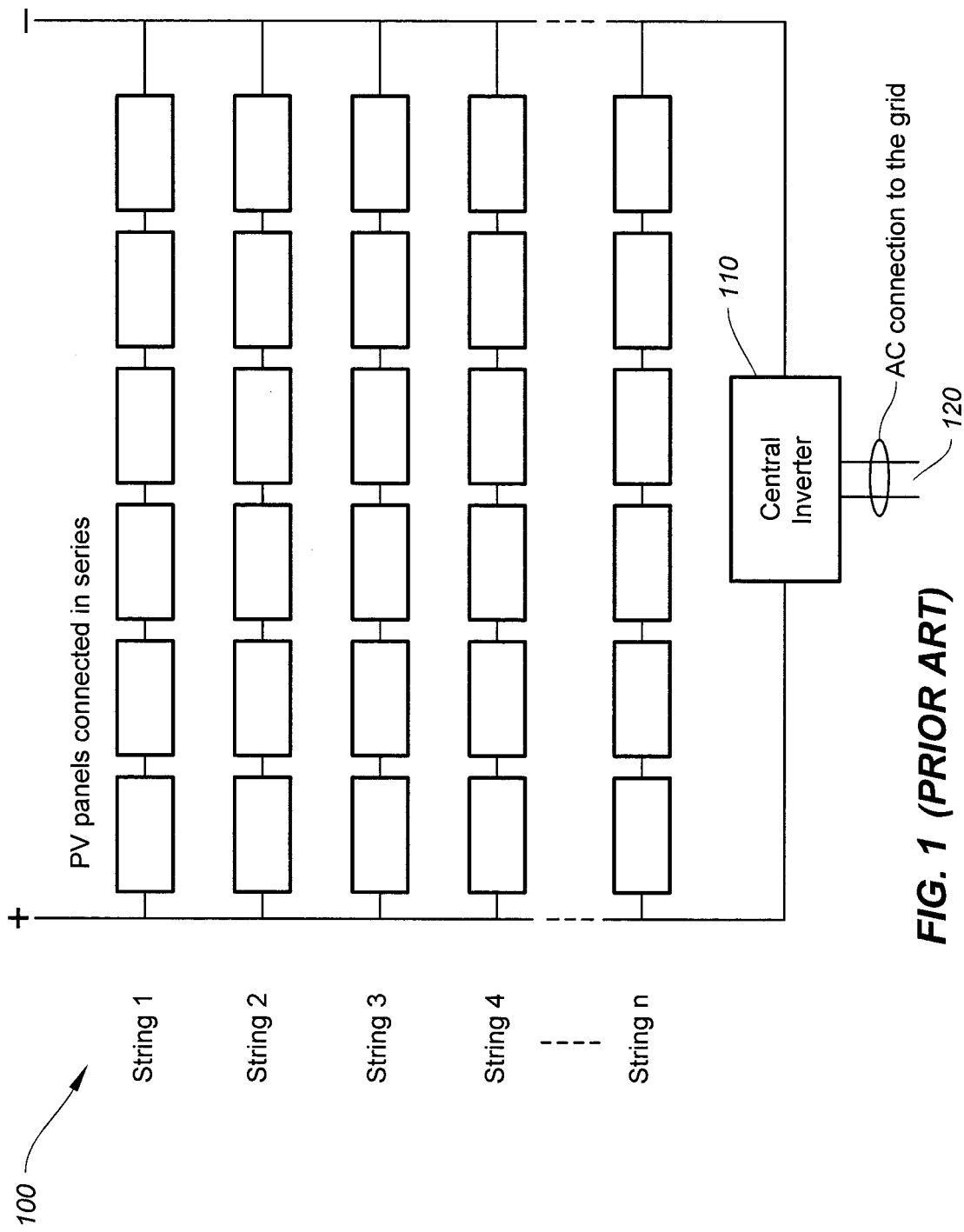
FIG. 1 is a simplified diagram of a conventional photovoltaic array.
Figure 2:
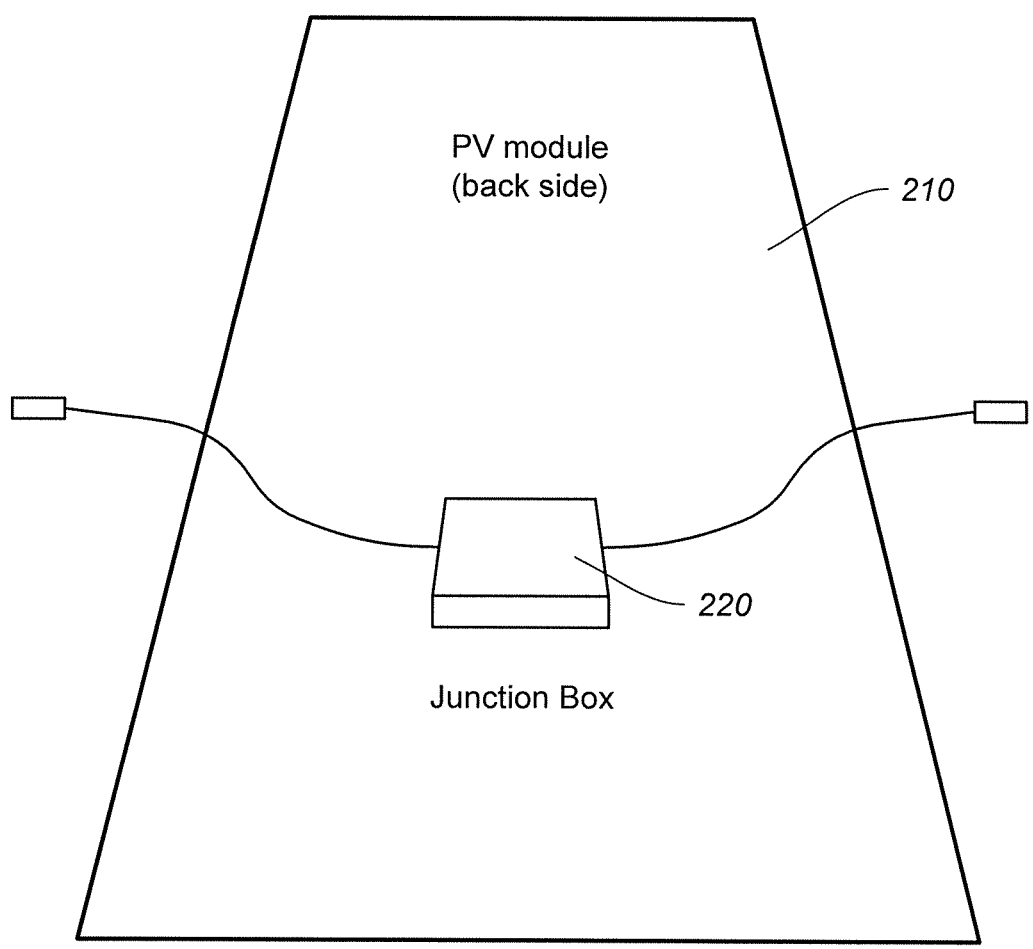
FIG. 2 is a simplified diagram of a conventional photovoltaic module.
Figure 3:
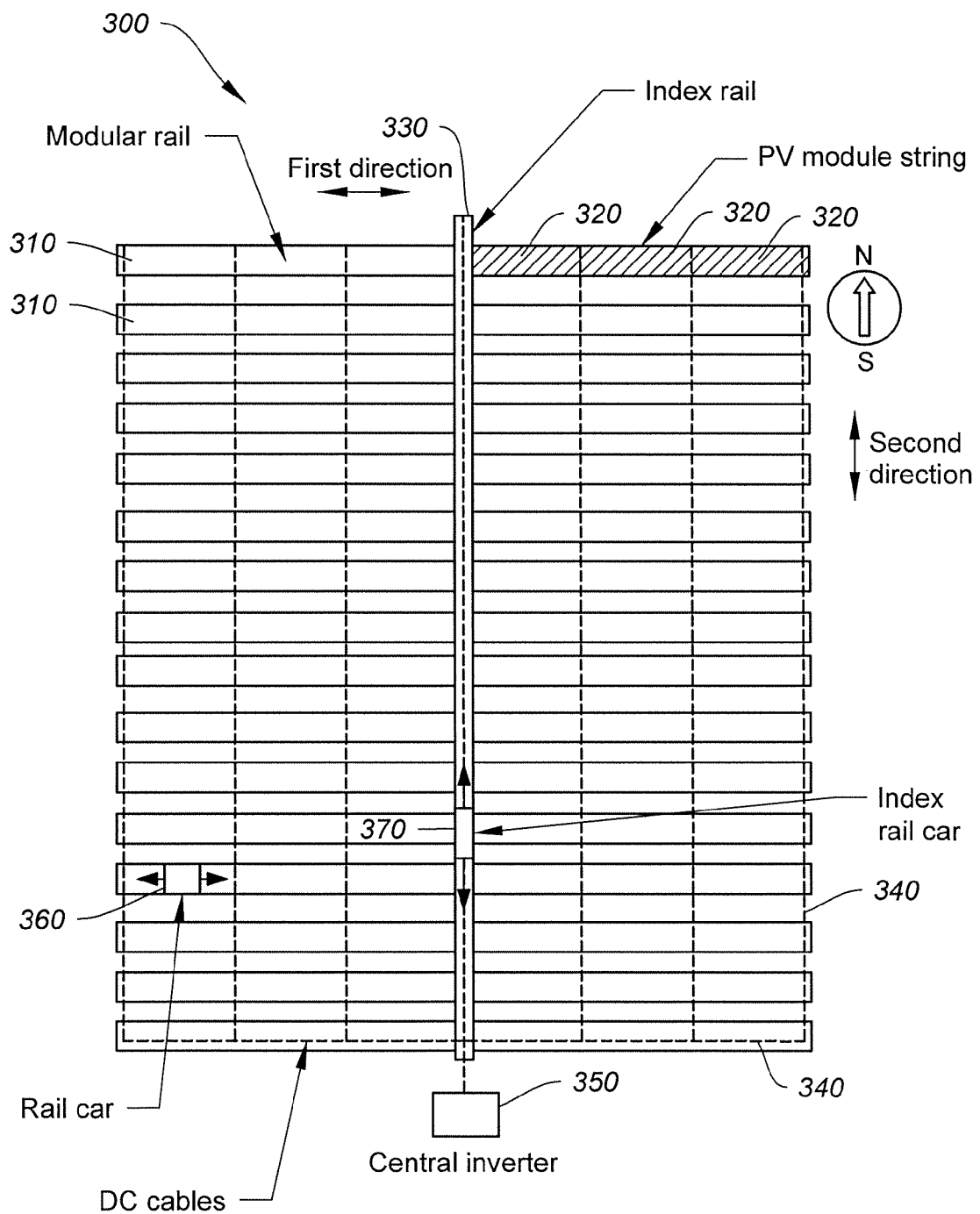
FIG. 3 is a simplified diagram showing a system for installation and operation of a photovoltaic array according to one embodiment of the present invention.

FIG. 3 is a simplified diagram showing a system for installation and operation of a photovoltaic array according to one embodiment of the present invention. This diagram is merely an example, which should not unduly limit the scope of the claims. One of ordinary skill in the art would recognize many variations, alternatives, and modifications. In FIG. 3, the photovoltaic array 300 is organized around one or more modular rails 310 (e.g. photovoltaic (PV) rails) oriented in a first direction. For example, the photovoltaic array 300 includes one or more photovoltaic modules. In another example, these modular rails 310 are arranged in a general east-west orientation. In yet another example, each modular rail 310 provides infrastructure for one or more module strings 320 (e.g. photovoltaic (PV) module strings) of one or more PV modules.

According to one embodiment, the modular rails 310 are crossed by one or more index rails 330 that are substantially perpendicular to the modular rails 310. For example, the index rails 330 are arranged in a second direction (e.g., a general north-south orientation). In another example, each of the modular rails 310 has a substantially uniform profile along its length. In yet another example, each of the index rails 330 has a substantially uniform profile along its length.

According to another embodiment, the photovoltaic array 300 includes one or more cables 340 (e.g. DC cables) that run in parallel along or perpendicularly to the modular rails 310 and/or the index rails 330. For example, the one or more cables 340 are connected to a central inverter 350, which is coupled to the power grid. In another example, each of the PV module strings 320 employs a string inverter, and/or each of the PV modules within the same string employs a micro-inverter. According to yet another example, the string inverter or the micro-inverter is used to convert the power generated at each string or module to AC power locally, without the need of the central inverter 350.

In one embodiment, one or more vehicles 360 (e.g. installation rail cars) are used to travel along the modular rails 310 and/or the index rails 330. For example, the one or more vehicles 360 are used to aid in the installation of the photovoltaic array 300. In another example, the one or more vehicles 360 are used to provide logistics and maintenance support for the photovoltaic array 300. In yet another example, the one or more vehicles 360 are used for transporting materials. In another embodiment, one or more vehicles 370 (e.g. index rail cars) are used for transporting vehicles and/or materials along the index rails 330.

Figure 4:
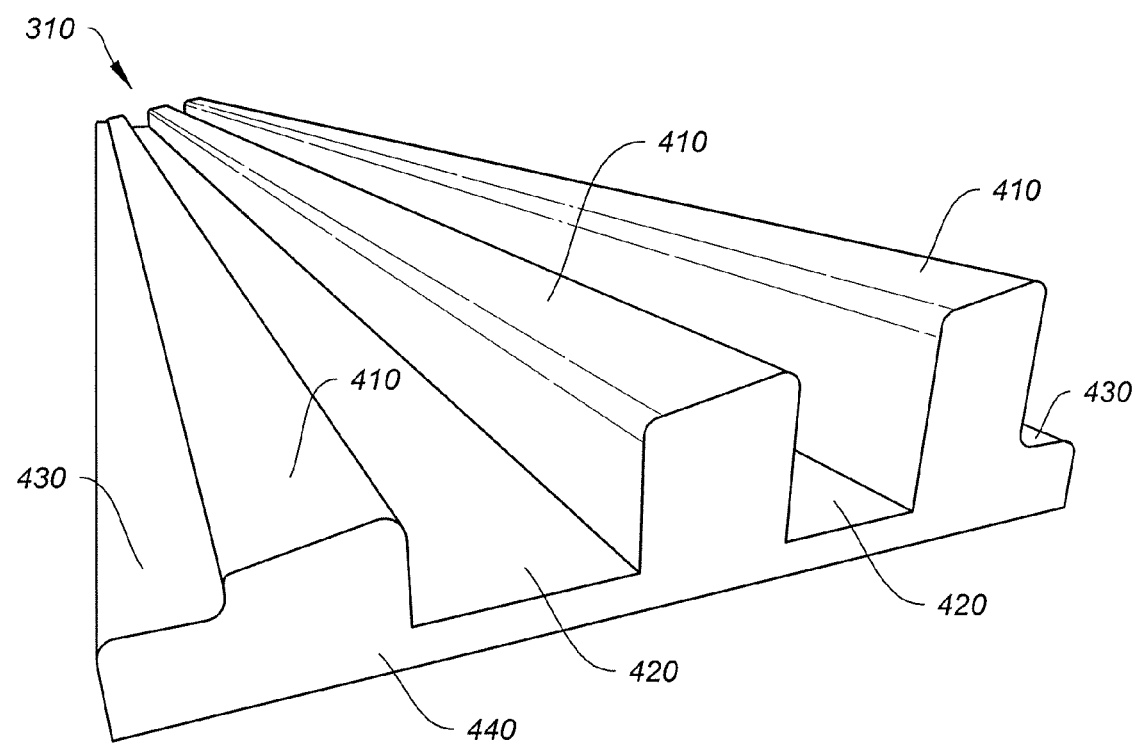
FIG. 4 is a simplified diagram showing the modular rail for installation and operation of the photovoltaic array according to one embodiment of the present invention.

FIG. 4 is a simplified diagram showing the modular rail 310 for installation and operation of the photovoltaic array according to one embodiment of the present invention. This diagram is merely an example, which should not unduly limit the scope of the claims. One of ordinary skill in the art would recognize many variations, alternatives, and modifications.

As shown in FIG. 4, the modular rail 310 includes one or more mounting surfaces 410. For example, the one or more mounting surfaces 410 serve as the mechanical substrate for the mounting of one or more PV modules and/or one or more PV module strings. In another example, the mounting surfaces 410 are substantially coplanar.

Figure 5:
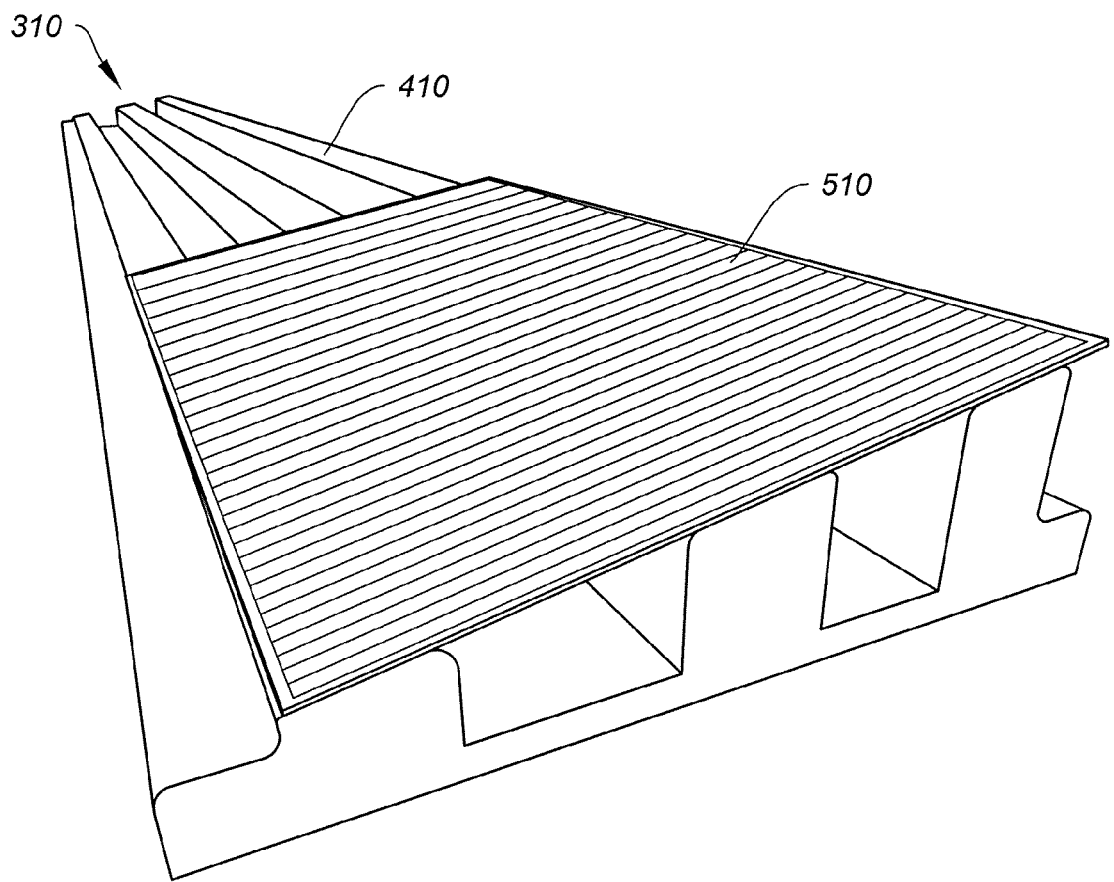
FIG. 5 is a simplified diagram showing the modular rail that supports one or more PV modules according to one embodiment of the present invention.

FIG. 5 is a simplified diagram showing the modular rail 310 that supports one or more PV modules according to one embodiment of the present invention. This diagram is merely an example, which should not unduly limit the scope of the claims. One of ordinary skill in the art would recognize many variations, alternatives, and modifications.

In one embodiment, a PV module 510 is affixed to the one or more mounting surfaces 410 by using at least one or more mechanical connectors. In another embodiment, a PV module 510 is affixed directly to the one or more mounting surfaces 410 by using one or more adhesive materials. For example, the one or more adhesive materials include a glue. In another example, the one or more adhesive materials include tape, paste, T5200, Silicone, epoxy, and/or Polyurethane foam. In yet another example, the PV module 510 is not affixed directly to the one or more mounting surfaces 410, but is affixed along with one or more flexible spacers using the one or more adhesive materials. In yet another embodiment, the one or more mounting surfaces 410 of the modular rail 310 are implemented with a tilt angle. For example, the tilt angle varies depending upon the geographic location (e.g. latitude or orientation) of the photovoltaic array so that the affixed PV module 510 is oriented for optimal energy capture from the light source (e.g., the Sun).

The use of the one or more mounting surfaces 410 provides certain advantages over conventional technology for the mounting of PV modules and PV module strings. In one embodiment, the PV modules 510 are fixed along their entire length to the one or more mounting surfaces 410 using glue or other adhesive materials. In another embodiment, the PV modules 510 do not have to be as strong as required by certain conventional technology. For example, the adhesive mounting along the one or more surfaces 410 provides a shorter span between the contact points of the PV modules 510 and the one or more mounting surfaces 410; therefore, the PV modules 510 are exposed to less mechanical stress due to wind loads than the PV modules mounted using conventional edge-mounted brackets. In another example, the PV modules 510 can be made of thinner material than the conventional edge-mounted PV modules; therefore, the PV modules 510 can be manufactured and transported at lower cost due to their lighter weight.

In yet another embodiment, the PV modules 510 benefit from the "heat sink" effect due to the proximity of the PV modules 510 to the modular rails 310. For example, the PV modules 510 can stay slightly cooler than conventional modules and can operate more efficiently (e.g., due to the negative temperature coefficient). In yet another embodiment, the use of flexible spacers can provide the PV modules 510 with additional air cooling that can significantly reduce negative effects caused by the "heat sink" effect of the modular rails 310.

Figure 6:
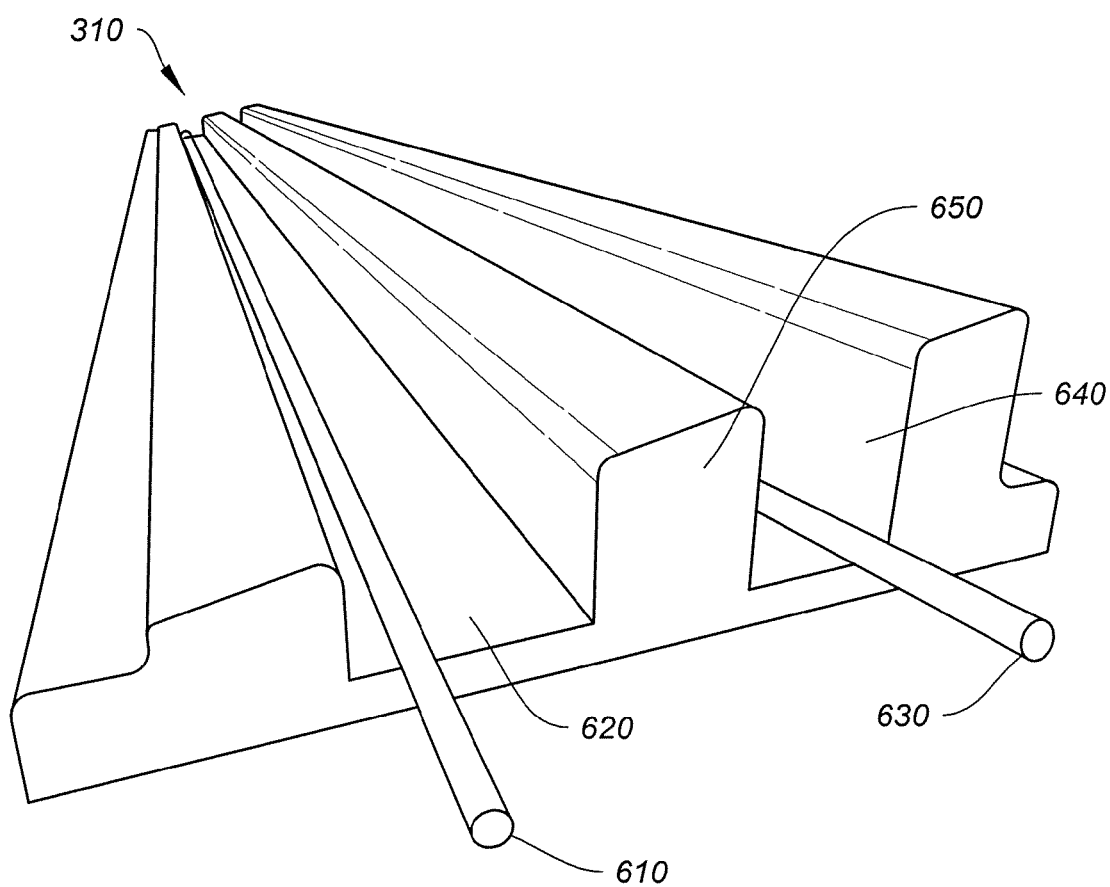
FIG. 6 is a simplified diagram showing placement of one or more cables in one or more plenums of the modular rail according to one embodiment of the present invention.

Returning to FIG. 4, in another embodiment, the modular rail 310 also includes one or more plenums 420 for the placement of one or more cables. FIG. 6 is a simplified diagram showing placement of one or more cables in one or more plenums of the modular rail 310 according to one embodiment of the present invention. This diagram is merely an example, which should not unduly limit the scope of the claims. One of ordinary skill in the art would recognize many variations, alternatives, and modifications.

In one embodiment, a cable 610 is placed in a first cable plenum 620 and/or another cable 630 is placed in a second cable plenum 640. For example, the one or more cables 340 include the cable 610 and/or the cable 630. In another example, additional plenums can be provided for additional cables. In another embodiment, the central mounting surface 650 is eliminated to form a single plenum in which the cable 610 and/or the cable 630 are placed together. For example, the elimination of the central mounting surface 650 results in reduced material costs for the modular rail 310 as well as a reduction in its overall weight. In yet another embodiment, the cable plenum 620 and/or the cable plenum 640 also has a cover that provides both mechanical and weather protection for the one or more cables.

In yet another embodiment, the modular rail 310 is scribed, slotted, and/or notched at one or more intervals along its length to provide one or more plenums for the placement of one or more cables (e.g., the one or more cables 340) that are perpendicular to the modular rail 310 and/or for the drainage of water from the modular rail 310. For example, the one or more notches are substantially perpendicular to the modular rail 310. In yet another embodiment, the cable 610 and/or the cable 630 does not need to be placed in the plenum 620 and/or the plenum 640, but could instead be placed separately from the modular rails 310, for example, in underground trenches. In yet another embodiments, the plenum 620 and/or the plenum 640 provides space to accommodate the junction box of a PV module.

According to some embodiments, the cable 610 and/or the cable 630 serve to interconnect the various PV modules or PV module strings. For example, the cables are used to send the DC power generated by the PV modules or PV module strings to a central inverter 350 for conversion to AC power and transmission to the power grid. According to certain embodiments, the cables are factory pre-made with connectors that allow for easy field interconnections between the PV module strings and the central inverter 350.

Returning again to FIG. 4, in one embodiment, the modular rail 310 also includes one or more vehicle support surfaces 430 (e.g., tracks, rails or road beds). In one embodiment, the one or more vehicle support surfaces 430 allow a vehicle to move along the modular rail 310. For example, the vehicle is used to install PV modules and/or provide logistics, operational, and/or maintenance support for the photovoltaic array. In another example, the modular rail 310 includes various positional indicators that are installed at intervals along its length. For example, the positional indicators include, but not limited to, magnetic wires, RFID modules, and/or visual indicators that denote the location of the particular modular rail segment within the larger photovoltaic array. In another example, a vehicle that operates along the modular rail includes sensors for detecting these positional indicators so that the vehicle can detect its location within the photovoltaic array.

As shown in FIG. 4, the modular rail 310 is optimized to reduce the amount of material needed per unit length. For example, the thickness of a bottom portion 440 of the modular rail 310 is optimized to reduce amount of material needed for a given surface roughness of a particular site. In one example, the modular rail 310 is constructed from concrete. In yet another example, the modulation rail 310 is constructed on site (e.g., being extruded in place using a slip-form extrusion machine).

As discussed above and further emphasized here, FIG. 4 is merely an example, which should not unduly limit the scope of the claims. One of ordinary skill in the art would recognize many variations, alternatives, and modifications. For example, the bottom portion 440 of the modular rail 310 has a bottom surface that forms one or more channels at one or more intervals along the length of the modular rail 310. In one embodiment, the one or more channels are perpendicular to the modular rail 310. In another embodiment, the one or more channels allow water to flow under the modular rail 310.

Figure 7:
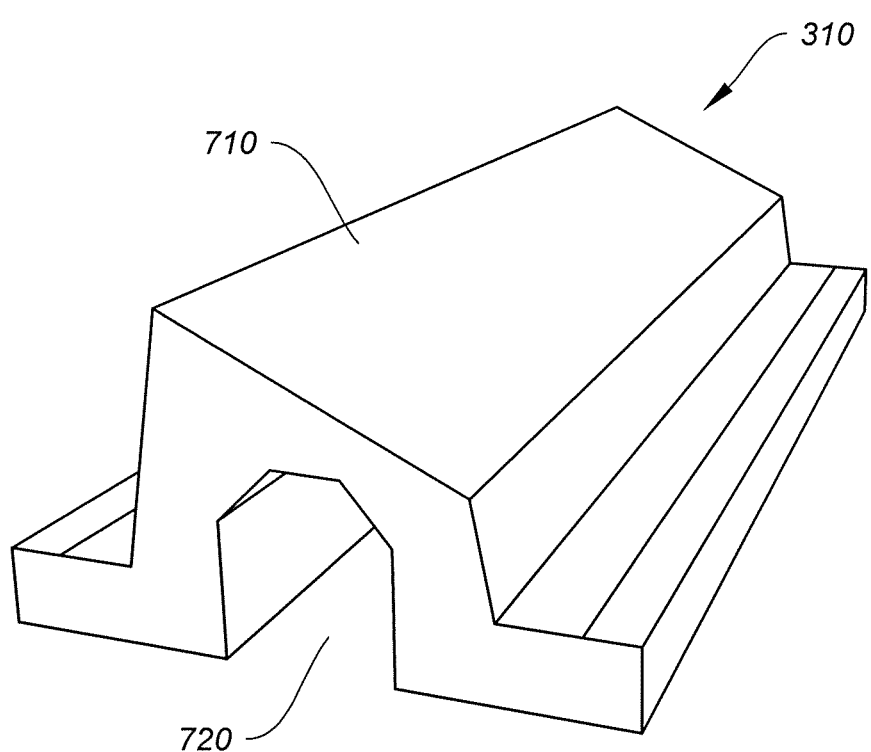
FIG. 7 is a simplified diagram showing the modular rail for installation and operation of the photovoltaic array according to another embodiment of the present invention.
Figure 8:
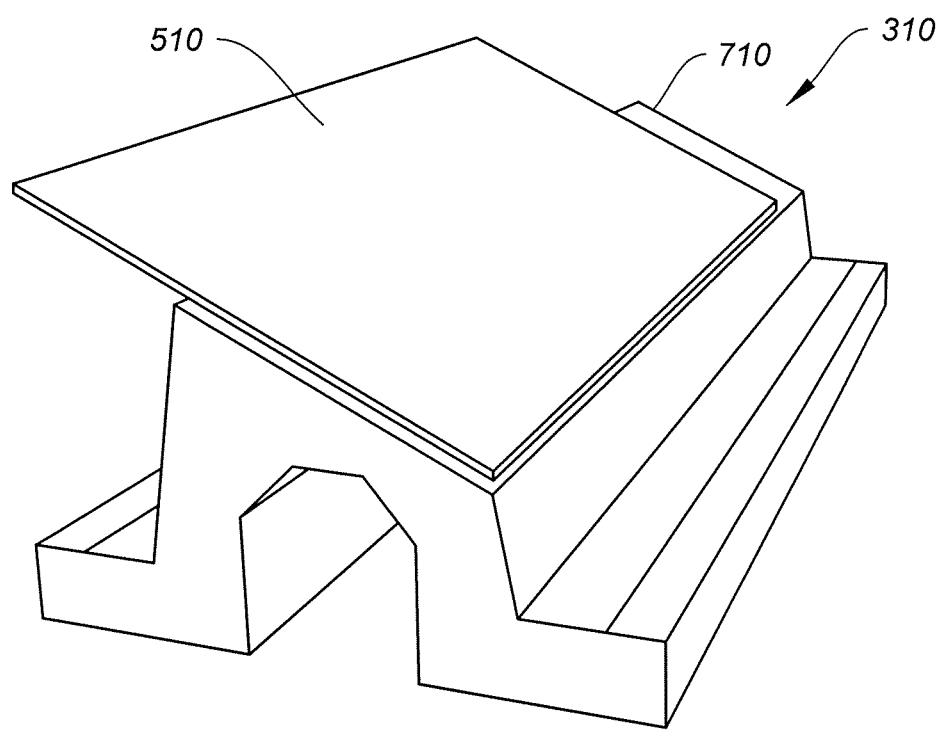
FIG. 8 is a simplified diagram showing the modular rail that supports the one or more PV modules according to another embodiment of the present invention.

FIG. 7 is a simplified diagram showing the modular rail 310 for installation and operation of the photovoltaic array according to another embodiment of the present invention. FIG. 8 is a simplified diagram showing the modular rail 310 that supports the one or more PV modules according to another embodiment of the present invention. These diagrams are merely examples, which should not unduly limit the scope of the claims. One of ordinary skill in the art would recognize many variations, alternatives, and modifications.

As shown in FIGS. 7 and 8, the modular rail 310 includes only a single mounting surface 710 for the PV module 510 or the PV module string according to one embodiment. In another embodiment, the modular rail 310 also includes a void 720, which, for example, reduces the amount of material needed per unit length and/or reduces the overall weight and cost of the modular rail 310.

Figure 9:
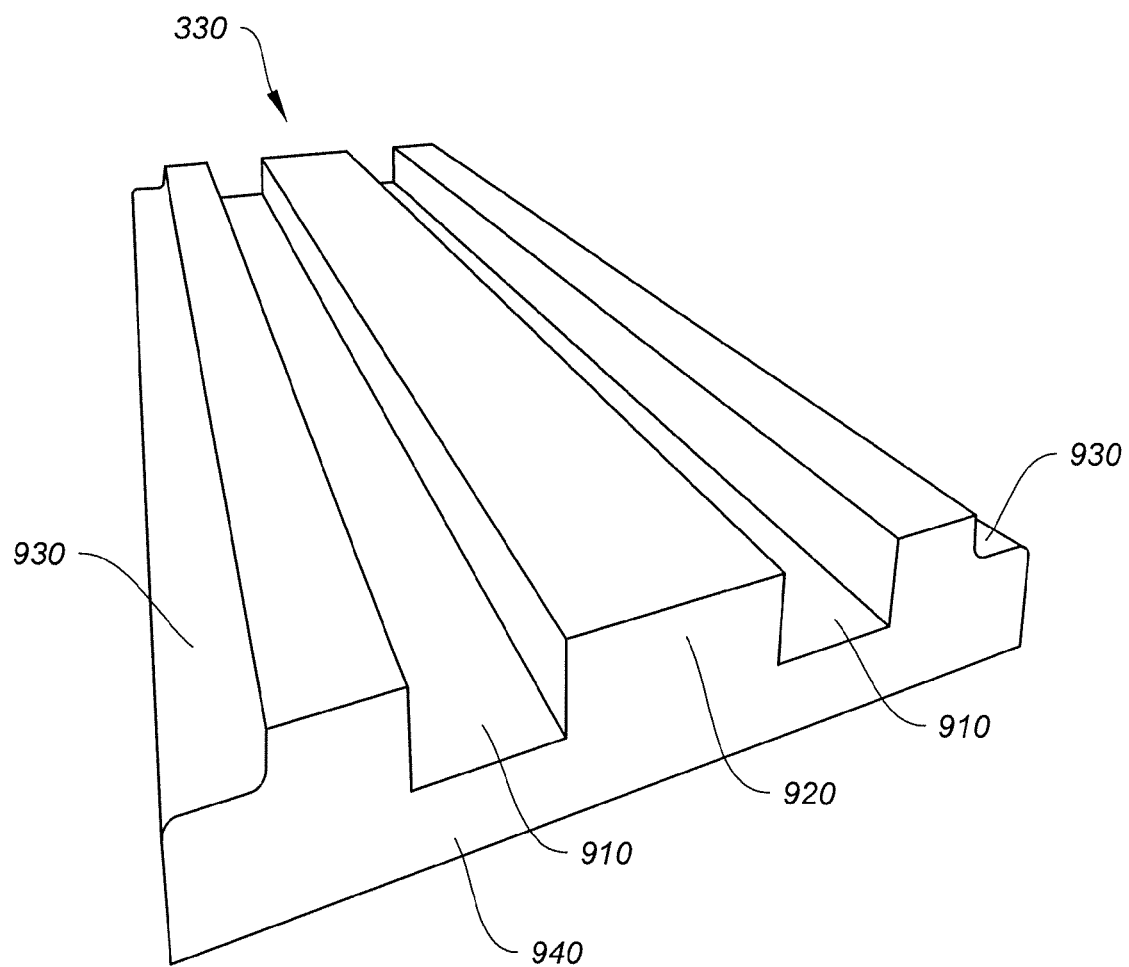
FIG. 9 is a simplified diagram showing the index rail for installation and operation of the photovoltaic array according to one embodiment of the present invention.
Figure 10:
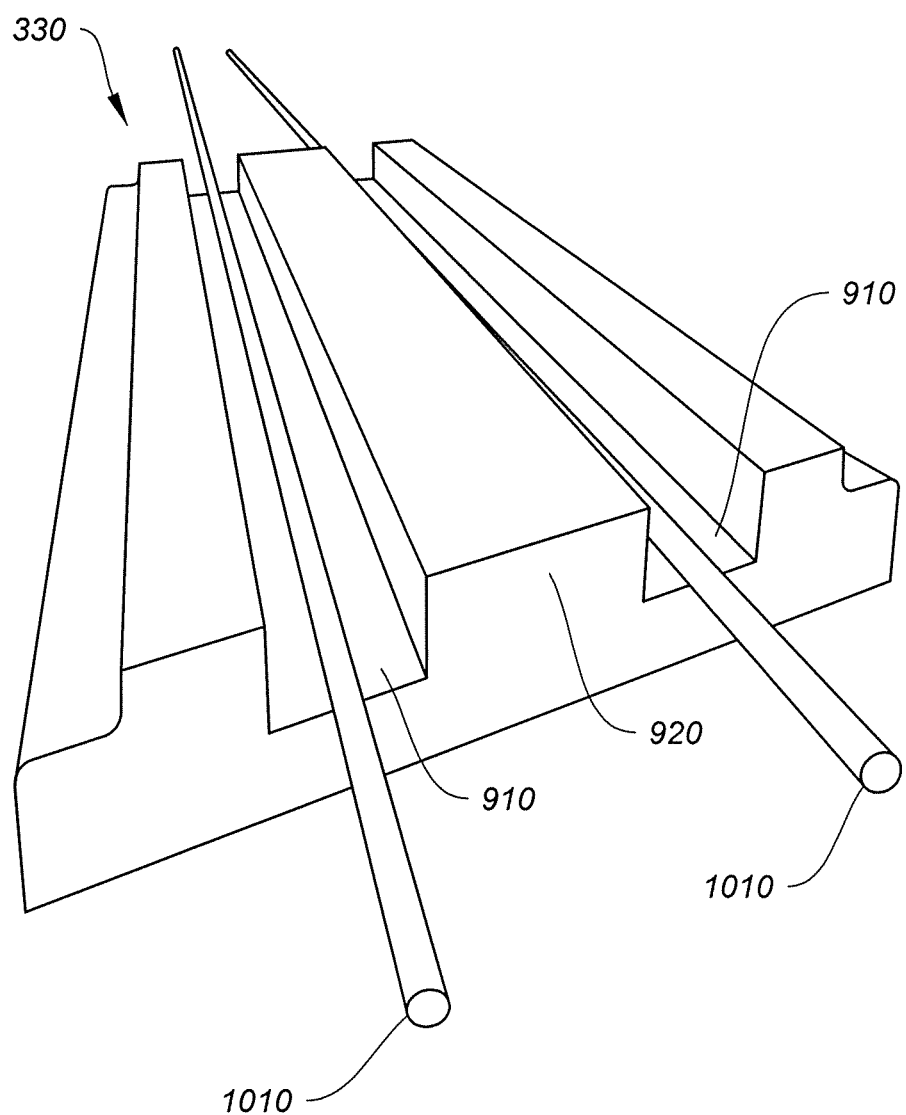
FIG. 10 is a simplified diagram showing placement of one or more cables in one or more plenums of the index rail according to one embodiment of the present invention.

FIG. 9 is a simplified diagram showing the index rail 330 for installation and operation of the photovoltaic array according to one embodiment of the present invention. Additionally, FIG. 10 is a simplified diagram showing placement of one or more cables in one or more plenums of the index rail 330 according to one embodiment of the present invention. These diagrams are merely examples, which should not unduly limit the scope of the claims. One of ordinary skill in the art would recognize many variations, alternatives, and modifications.

In one embodiment, the index rail 330 includes one or more plenums 910. For example, two adjacent plenums 910 are separated by a divider 920. In another example, the one or more plenums 910 are used for the placement of one or more cables 1010. In yet another example, the one or more cables 340 include the one or more cables 1010. In another embodiment, the index rail 330 is used to support movement between modular rails. In yet another embodiment, the divider 920 of the index rail 330 is eliminated so that one or more cables 1010 are placed in the same plenum of the index rail 330. In yet another embodiment, the one or more cables 1010 are interconnected with the cable 610 and/or the cable 630 in order to, for example, collect the generated power at the central inverter 350 for transmission to the power grid.

According to one embodiment, the one or more cable plenums 910 also have one or more covers that provide both mechanical and weather protection for the one or more cables. According to another embodiment, the index rail 330 is scribed, slotted, or notched at one or more intervals along its length to provide one or more plenums for the placement of one or more cables (e.g., the one or more cables 340) that are perpendicular to the index rail 330 and/or for the drainage of water from the index rail 330. For example, the one or more notches are substantially perpendicular to the index rail 330. According to yet another embodiment, the one or more cables 1010 do not need to be placed in the one or more plenums 910, but could instead be placed separately from the index rail 330, for example, in underground trenches.

As shown in FIG. 9, in one embodiment, the index rail 330 also includes one or more vehicle support surfaces 930 (e.g., tracks, rails or road beds). In one embodiment, the one or more vehicle support surfaces 930 allow a vehicle to move along the index rail 330. For example, the vehicle is used to install PV modules and/or provide logistics, operational, and/or maintenance support for the photovoltaic array. In another example, the index rail 330 includes various positional indicators that are installed at intervals along its length. For example, the positional indicators include, but not limited to, magnetic wires, RFID modules, and/or visual indicators that denote the location of the particular index rail segment within the larger photovoltaic array. In another example, a vehicle that operates along the index rail includes sensors for detecting these positional indicators so that the vehicle can detect its location within the photovoltaic array.

In another embodiment, the index rail 330 is optimized to reduce the amount of material needed per unit length. For example, the thickness of a bottom portion 940 of the index rail 330 is optimized to reduce amount of material needed for a given surface roughness of a particular site. In one example, the index rail 330 is constructed from concrete. In yet another example, the index rail 330 is constructed on site (e.g., being extruded in place using a slip-form extrusion machine).

As discussed above and further emphasized here, FIG. 9 is merely an example, which should not unduly limit the scope of the claims. One of ordinary skill in the art would recognize many variations, alternatives, and modifications. For example, the bottom portion 940 of the index rail 330 has a bottom surface that forms one or more channels at one or more intervals along the length of the index rail 330. In one embodiment, the one or more channels are perpendicular to the index rail 330. In another embodiment, the one or more channels allow water to flow under the index rail 330.

Figure 11:
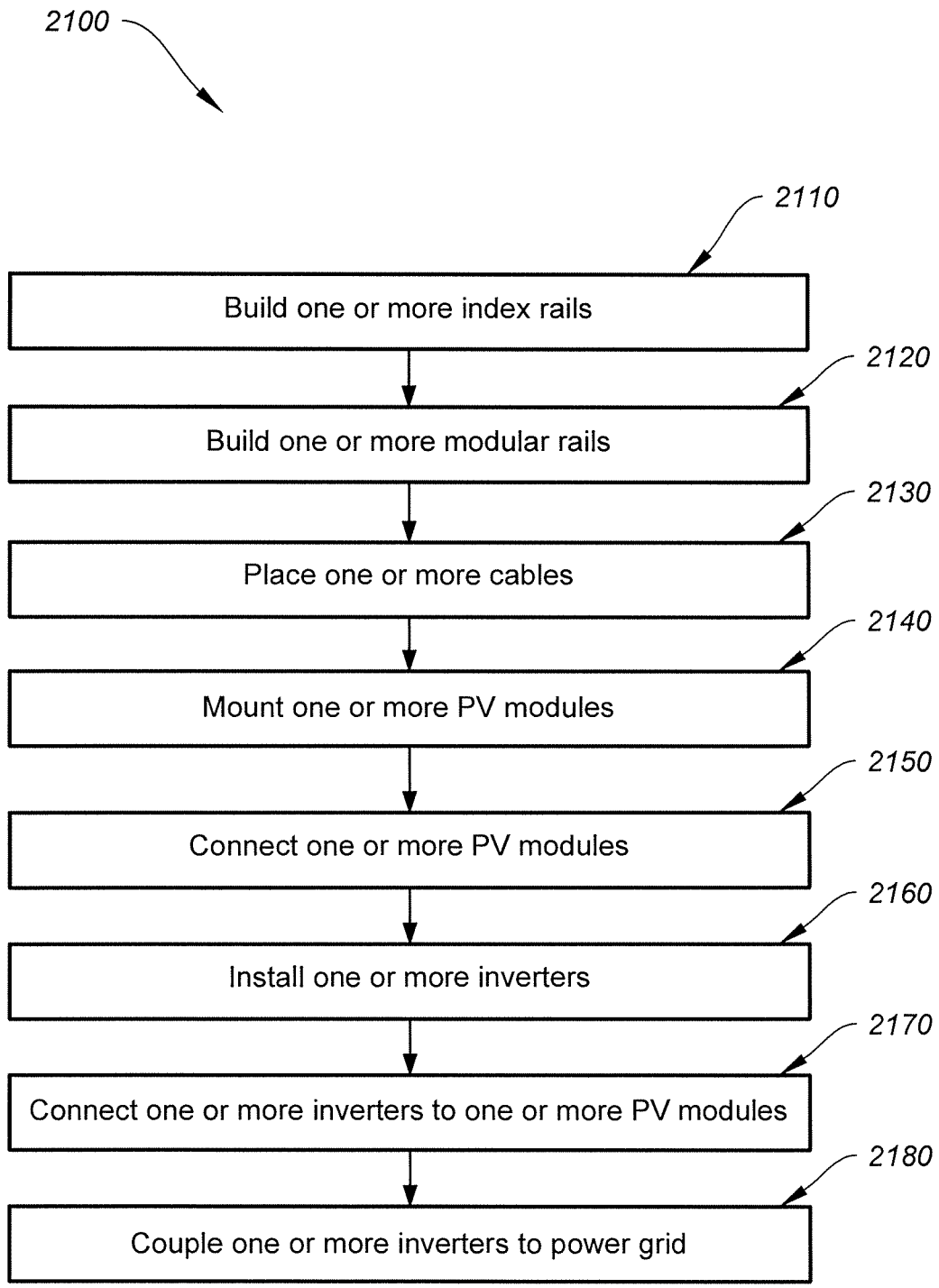
FIG. 11 is a simplified diagram showing a method for constructing the photovoltaic array according to one embodiment of the present invention.

FIG. 11 is a simplified diagram showing a method for constructing the photovoltaic array 300 according to one embodiment of the present invention. This diagram is merely an example, which should not unduly limit the scope of the claims. One of ordinary skill in the art would recognize many variations, alternatives, and modifications. The method 2100 includes a process 2110 for building the one or more index rails 330, a process 2120 for building the one or more modular rails 310, a process 2130 for placing the one or more cables 340, a process 2140 for mounting the one or more PV modules along the one or more modular rails 310, a process 2150 for connecting the one or more PV modules, a process 2160 for installing the one or more inverters, a process 2170 for connecting the one or more inverters to the one or more PV modules, and a process 2180 for coupling the one or more inverters to the power grid.

According to certain embodiments, the process 2110 for building the one or more index rails 330 and/or the process 2120 for building the one or more modular rails 310 can be performed with various methods. For example, the installation site is graded, to the extent necessary, where each of the one or more index rails 330 and/or the one or more modular rails 310 are to be placed. In another example, one or more "carpets" of reinforcing mesh are rolled out where each rail is to be placed. These "carpets" are made of concrete iron rebar mesh and/or of other non-metal reinforcing meshes of materials such as polymers and/or glass fibers. Afterwards, a specialized machine (e.g. a slip-form extrusion machine) lays a continuous profile of concrete that makes up each rail according to one embodiment.

As a specific example, the slip-form extrusion machine is used to create a customized profile. In one embodiment, the uneven surface of the ground where each rail is cast is naturally filled with concrete in between the reinforcing mesh to provide a stable rail track. In another embodiment, at one or more intervals along the length of each rail, the concrete rail is scribed, slotted, and/or notched (e.g., before or after the concrete has cured) to ensure separation of the rail for thermal expansion and contraction to prevent cracking of the rail. In yet another embodiment, the scribes, slots, and/or notches also serve as water drainage points along each rail to keep each cable plenum dry as well as to provide access points for the cable that connect to the ends of the PV module strings.

Referring to the process 2110, the one or more index rails 330 are placed substantially parallel to each other in a first direction according to one embodiment. For example, this first direction is approximately north-south in orientation. In another example, once the one or more index rails 330 are in place, they provide a convenient mechanism for the transportation of materials and other equipment across the installation site by use of the vehicle support surfaces 930 of the index rails. In other embodiments, the array of rails allows for movement around the array while avoiding the problems of ground water and mud.

Referring to the process 2120, the one or more modular rails 310 are placed substantially perpendicular to the one or more index rails 330 according to another embodiment. For example, the one or more modular rails 310 are placed in an approximately east-west orientation.

As shown in FIG. 11, at the process 2130, the one or more cables 340 are placed. For example, once the one or more index rails 330 and/or the one or more modular rails 310 are in place, the one or more cables 340 are placed using one or more of the various plenums and scribes, slots, and/or notches. In another example, the one or more cables 340 route the DC power generated by the PV modules to the central inverter 350 for conversion.

At the process 2140, the one or more PV modules (e.g., the PV module 510) are mounted along the one or more modular rails 310. For example, the process 2140 is performed by at least the one or more robotic arms 1640. In another example, the installation process for the PV modules includes multiple operations that can be performed in various orders. In one embodiment, these multiple operations include affixing a PV module (e.g., a solar panel) to the one or more mounting surfaces of a modular rail 310 using at least one or more mechanical connectors and/or one or more adhesive materials. For example, the one or more adhesive materials include glue, tape, paste, T5200, Silicone, epoxies, and/or Polyurethane foam. In another embodiment, one or more PV modules are installed end-to-end along the modular rail 310 to form a PV module string 320.

At the process 2150, the one or more PV modules are connected. For example, the one or more PV modules (e.g., the PV module 510) are connected using one or more types of interconnectors (e.g., a rigid in-line slide-on interconnector, a flexible slide-in interconnector, a flexible ribbon interconnector, and/or an in-line slide-in edge interconnector). In another example, the one or more PV modules (e.g., the PV module 510) are connected using one or more types of conventional interconnectors. In one embodiment, one or more interconnectors are used to provide electrical connections between the PV modules. In another embodiment, the one or more interconnectors can provide additional structural stability between the PV modules. In yet another embodiment, the one or more interconnectors can eliminate the conventional junction boxes. In yet another embodiment, the one or more interconnectors also reduce or eliminate the need for the extensive cabling often found in a conventional photovoltaic array. In yet another embodiment, the one or more interconnectors are used to connect individual PV modules into PV module strings. In yet a further embodiment, the one or more interconnectors are used to provide flexible interconnections between the PV modules in order to reduce the stresses caused by heating and cooling of the PV modules.

As shown in FIG. 11, at the processes 2160, 2170, and 2180, the one or more inverters are installed, connected to the one or more PV modules, and coupled to the power grid according to certain embodiments.

Figure 12:
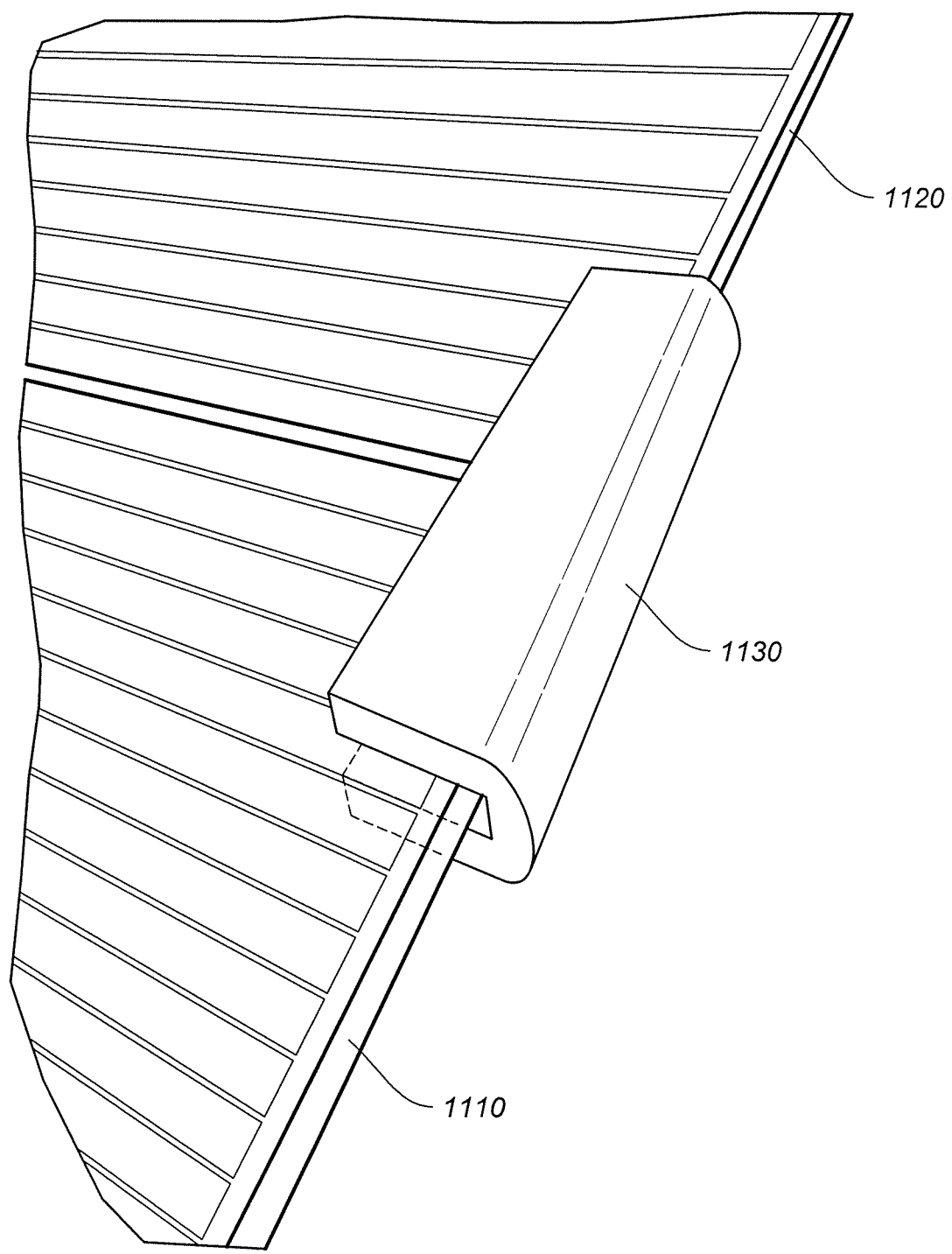
FIG. 12 is a simplified diagram showing a PV-module interconnection apparatus used for installation and operation of the photovoltaic array according to an embodiment of the present invention.

FIG. 12 is a simplified diagram showing a PV-module interconnection apparatus used for installation and operation of the photovoltaic array 300 according to an embodiment of the present invention. This diagram is merely an example, which should not unduly limit the scope of the claims. One of ordinary skill in the art would recognize many variations, alternatives, and modifications. As shown in FIG. 12, a PV module 1110 is connected to another PV module 1120 using a rigid in-line slide-on interconnector 1130. As an example, the rigid in-line slide-on interconnector 1130 includes a connector surface that mates with the flat contact areas of at least two PV modules 1110 and 1120. In another example, the rigid in-line slide-on interconnector 1130 is in contact with the front glass and/or the back glass of at least two PV modules 1110 and 1120 and is folded over the edge of the front glass and/or the back glass of the PV modules 1110 and 1120.

Figure 13:
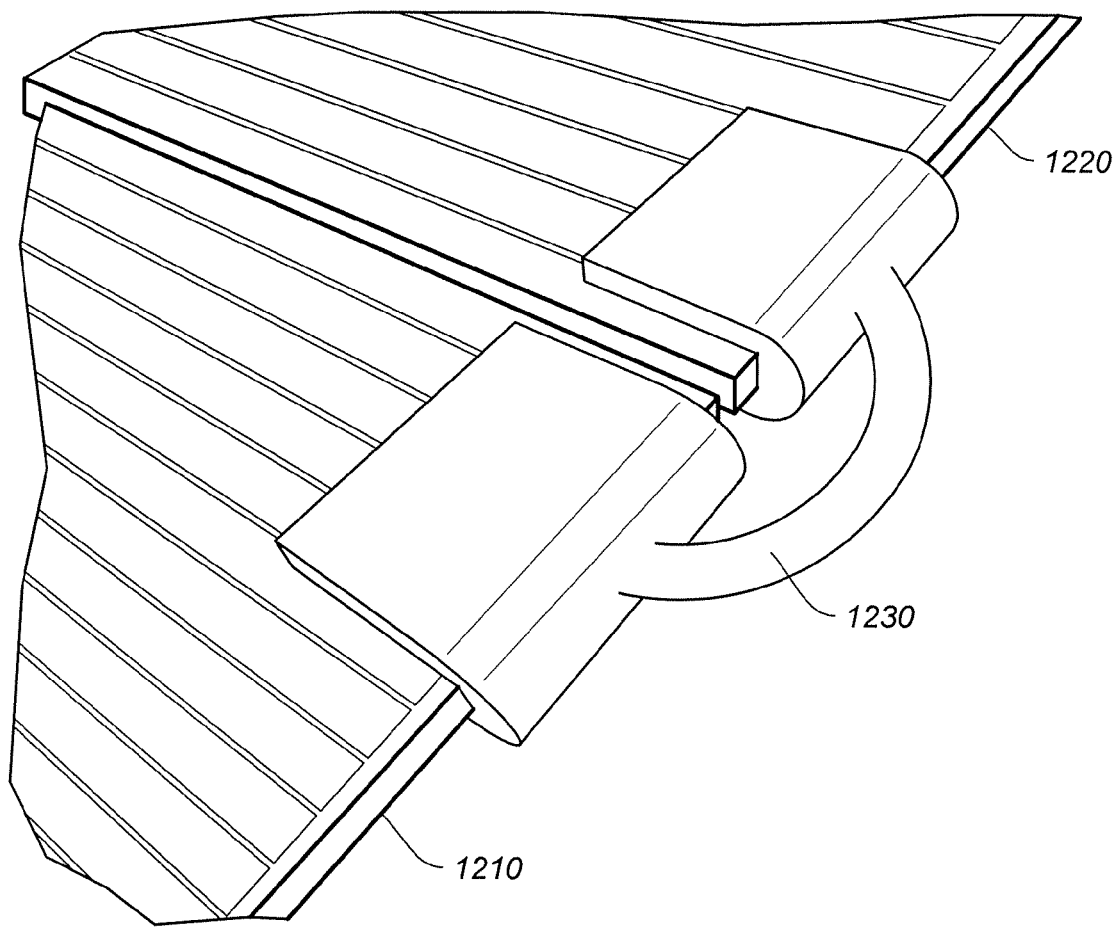
FIG. 13 is a simplified diagram showing a PV module interconnection apparatus used for installation and operation of the photovoltaic array according to another embodiment of the present invention.

FIG. 13 is a simplified diagram showing a PV module interconnection apparatus used for installation and operation of the photovoltaic array 300 according to another embodiment of the present invention. This diagram is merely an example, which should not unduly limit the scope of the claims. One of ordinary skill in the art would recognize many variations, alternatives, and modifications. As shown in FIG. 13, a PV module 1210 is connected to another PV module 1220 using a flexible slide-on interconnector 1230. As an example, the flexible slide-on interconnector 1230 includes two separate connector surfaces, which mate with the flat contact areas of the PV modules 1210 and 1220 respectively. In another example, the flexible slide-on interconnector 1230 is in contact with the front glass and/or the back glass of at least two PV modules 1210 and 1220 and is folded over the edge of the front glass and/or the back glass of the PV modules 1210 and 1220.

Figure 14:
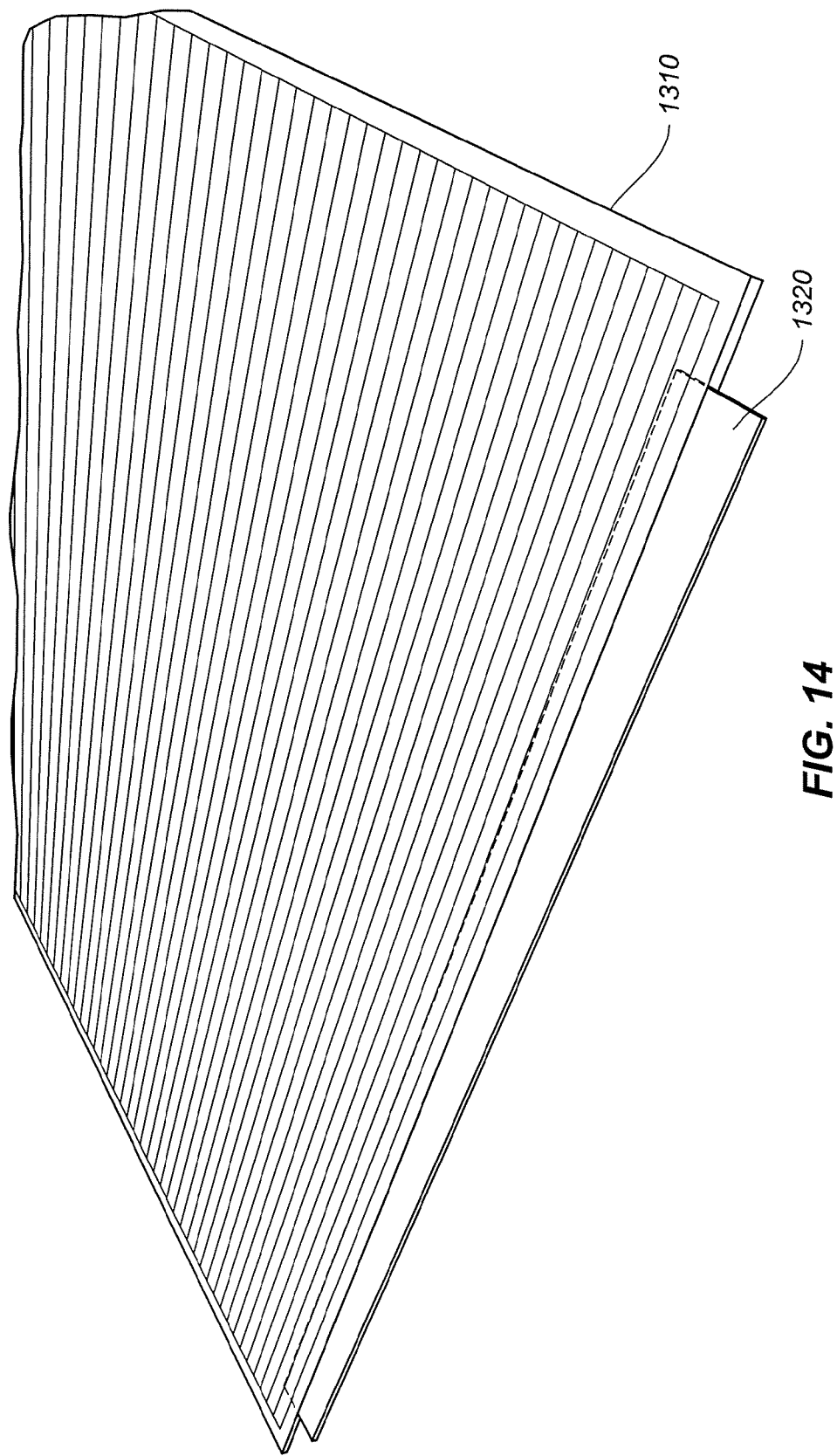
FIG. 14 is a simplified diagram showing a PV module interconnection apparatus used for installation and operation of the photovoltaic array according to yet another embodiment of the present invention.

FIG. 14 is a simplified diagram showing a PV module interconnection apparatus used for installation and operation of the photovoltaic array 300 according to yet another embodiment of the present invention. This diagram is merely an example, which should not unduly limit the scope of the claims. One of ordinary skill in the art would recognize many variations, alternatives, and modifications. As shown in FIG. 14, a PV module 1310 is connected to another PV module using a flexible ribbon interconnector 1320. As an example, the flexible ribbon interconnector 1320 is integrated with at least two PV modules. In one embodiment, the flexible ribbon interconnector 1320 is partially inserted between the front glass and the back glass of the PV module 1310 and between the front glass and the back glass of another PV module. In another embodiment, the flexible ribbon interconnector 1320 allows factory preassembly (including pre-interconnection) of PV modules. After the preassembly, the PV modules can be folded on top of each other for storage and/or transportation according to some embodiments.

Figure 15:
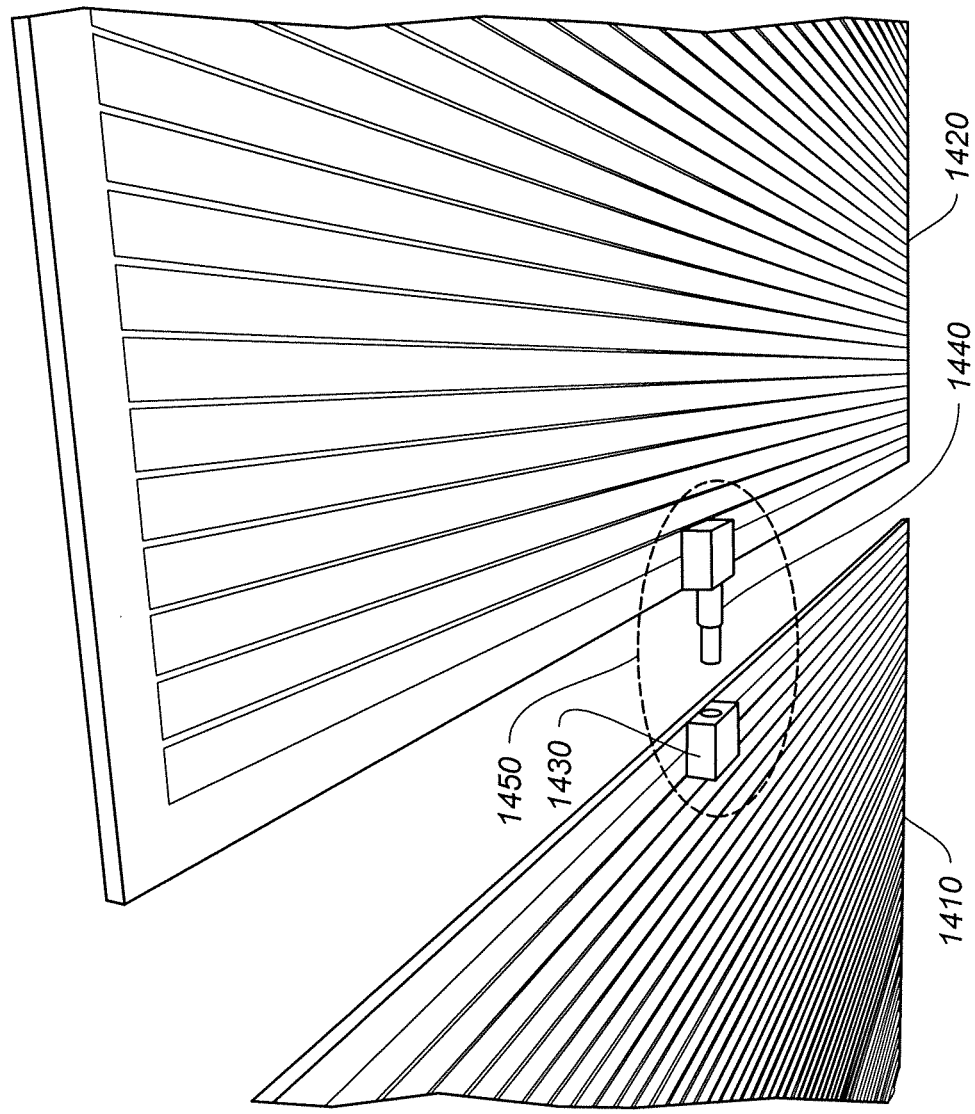
FIGS. 15 and 16 are simplified diagrams showing a PV module interconnection apparatus used for installation and operation of the photovoltaic array according to yet another embodiment of the present invention.
Figure 16:
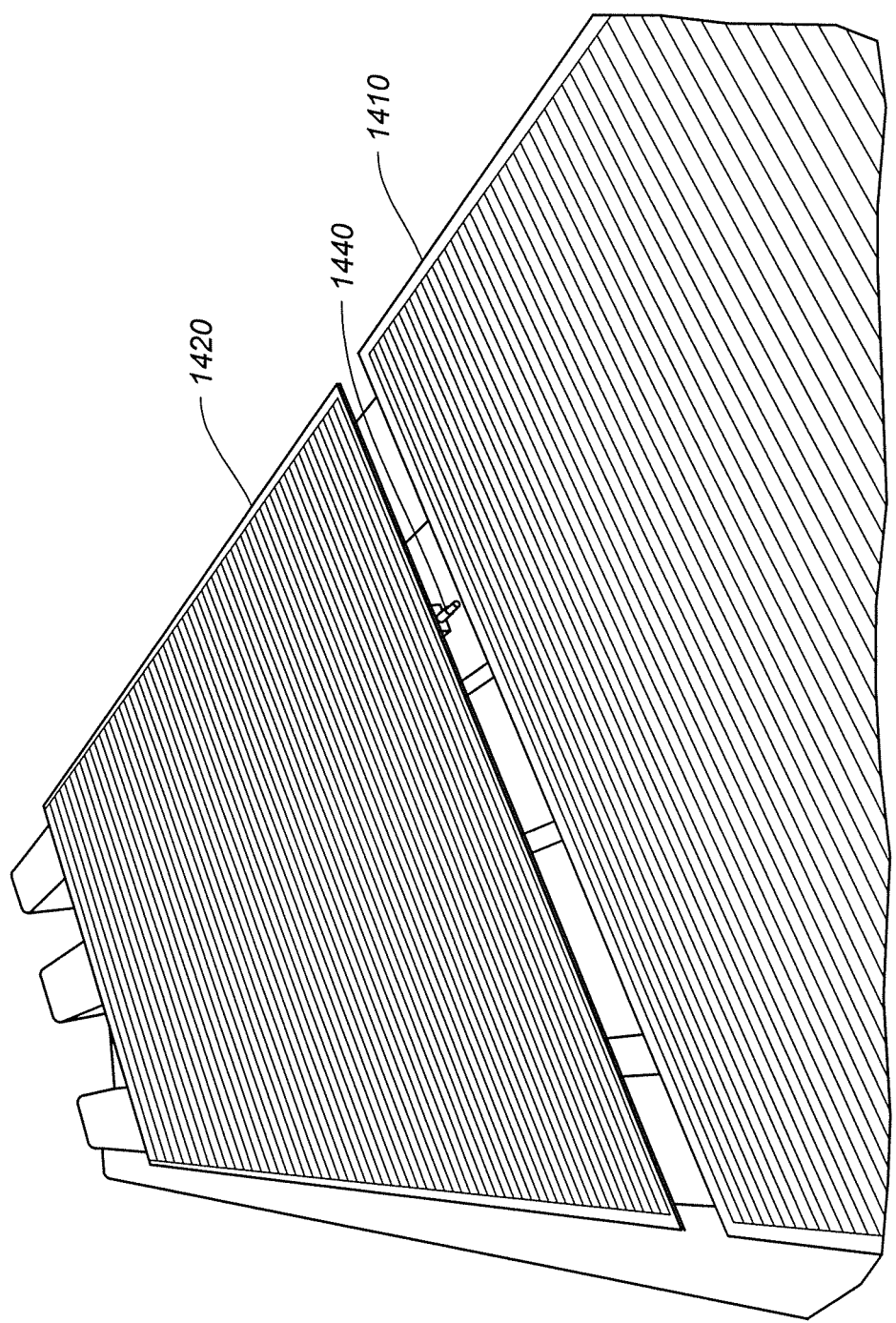

FIGS. 15 and 16 are simplified diagrams showing a PV module interconnection apparatus used for installation and operation of the photovoltaic array 300 according to yet another embodiment of the present invention. These diagrams are merely examples, which should not unduly limit the scope of the claims. One of ordinary skill in the art would recognize many variations, alternatives, and modifications.

In one embodiment, a PV module 1410 is connected to another PV module 1420 using an in-line slide-in edge interconnector 1450. As an example, the in-line slide-in edge interconnector 1450 is mounted under two PV modules 1410 and 1420. In one embodiment, the in-line slide-in edge interconnector 1450 allows for automatic installation. In another embodiment, the in-line slide-in edge interconnector 1450 can improve environmental and mechanical protection. In another embodiment, the in-line slide-in edge interconnector 1450 includes a male connector 1440 and a female connector 1430. For example, the male connector 1440 and the female connector 1430 are mounted under two different PV modules 1420 and 1410, respectively. In another example, the pin on the male connector 1440 can slide in and out of the mating socket on the corresponding female connector 1430. In yet another example, the in-line slide-in edge interconnector 1450 allows for movement (e.g., due to thermal expansion) to take place between the PV modules 1410 and 1420. In yet another embodiment, in-line slide-in edge interconnectors 1450 are pre-mounted onto multiple PV modules so that the multiple PV modules can be installed as a group to become a PV module string 320. In yet another embodiment, the in-line slide-in edge interconnectors 1450 are mounted onto multiple PV modules during installation of the PV modules.

Figure 17:
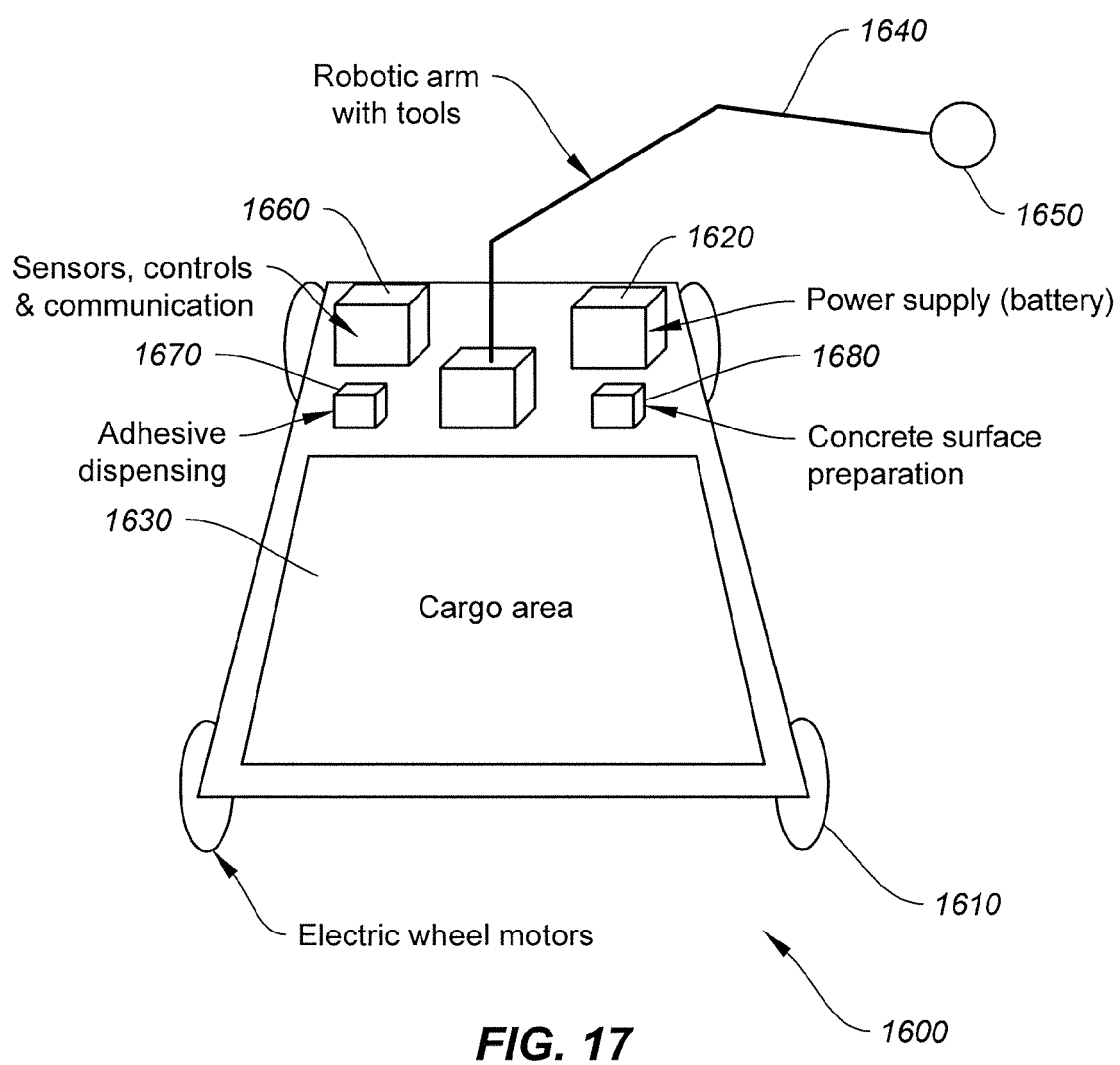
FIG. 17 is a simplified diagram of a vehicle for performing one or more tasks in the photovoltaic array according to one embodiment of the present invention.

FIG. 17 is a simplified diagram of a vehicle for performing one or more tasks in the photovoltaic array 300 according to one embodiment of the present invention. This diagram is merely an example, which should not unduly limit the scope of the claims. One of ordinary skill in the art would recognize many variations, alternatives, and modifications. A vehicle 1600 includes one or more wheels 1610, one or more power supplies 1620, one or more cargo areas 1630, one or more robotic arms 1640, one or more tools 1650, one or more devices 1660 for sensing, controlling, and/or communicating, one or more adhesive dispensing apparatuses 1670, and one or more apparatuses 1680 for concrete surface preparation.

For example, the vehicle 1600 can be operated along the one or more modular rails 310 and/or the one or more index rails 330. In another example, the vehicle 1600 is used as the vehicle 360 and/or the vehicle 370. In yet another example, the vehicle 1600 can perform one or more automated tasks and can have one or more features depending upon the particular embodiments.

In one embodiment, the vehicle 1600 can use one or more vehicle support surfaces (e.g., the one or more vehicle support surfaces 430 and/or the one or more vehicle support surfaces 930). For example, the vehicle 1600 includes the one or more wheels 1610 that roll around on the one or more vehicle support surfaces. In another example, other forms of locomotion can be used, for example continuous tracks and/or caterpillar treads may be used. In another embodiment, the vehicle 1600 can use various forms of propulsion for locomotion. For example, one or more electrical motors are used to drive one or more of the wheels and/or caterpillar treads. In another example, hydraulics can be used to drive one or more of the wheels and/or caterpillar treads. In yet another example, an internal combustion engine can be used to drive one or more of the wheels and/or caterpillar treads.

In another embodiment, the vehicle 1600 can access one or more power sources to run its various systems. For example, the vehicle 1600 uses one or more batteries as the one or more power supplies 1620. In another example, the vehicle 1600 uses an internal combustion generator for generating power and/or recharging the one or more batteries. In yet another example, the vehicle 1600 uses one or more PV modules for generating power and/or recharging the one or more batteries. In yet another example, the vehicle 1600 is capable of recharging the one or more batteries using one or more dedicated charging stations located at one or more locations within the photovoltaic array 300. In yet another example, the vehicle 1600 uses other alternative fuel sources and generators.

In yet another embodiment, the vehicle 1600 includes the one or more cargo areas 1630 for transporting materials and supplies throughout the photovoltaic array 300. For example, the one or more cargo areas 1630 can be used to transport one or more PV modules to their points of installation. In another example, the one or more cargo areas 1630 can be used to transport one or more replacement PV modules to one or more desired locations and then carry away one or more replaced PV modules. In yet another example, the one or more cargo areas 1630 can be used to transport one or more cables, adhesive materials, connectors, and/or other supplies needed during the installation and operation of the photovoltaic array 300.

As shown in FIG. 17, the vehicle 1600 includes the one or more robotic arms 1640 and/or the one or more tools 1650 according to one embodiment. For example, each of the one or more robotic arms 1640 is equipped with a universal gripping attachment. In another example, each of the one or more robotic arms 1640 is equipped with one or more specialized tools 1650. In one embodiment, the one or more specialized tools 1650 includes a special glass-panel lifting tool for lifting and/or manipulating one or more glass PV modules. In another embodiment, the one or more specialized tools 1650 can be used to apply the one or more adhesive materials. In yet another embodiment, the one or more specialized tools 1650 can be used to place cables, install the one or more interconnectors (e.g., the interconnector 1130, the interconnector 1230, the interconnector 1320, and/or the interconnector 1450) between the PV modules, transport materials and supplies throughout the photovoltaic array 300, load and unload supplies, and/or any of many other tasks needed during installation and operation of the photovoltaic array 300.

According to certain embodiments, the vehicle 1600 includes the one or more devices 1660 for sensing, controlling, and/or communicating. For example, the one or more devices 1660 are used at least for sensing. In one embodiment, the vehicle 1600 is equipped with one or more sensors used to determine its location within the photovoltaic array 300. For example, the one or more sensors include a sensor for global positioning system (GPS), a mechanical sensor, a wheel sensor, an optical sensor, an RFID sensor, and/or a magnetic sensor. In another example, the wheel sensor is used to keep track of the location of the vehicle 1600 along the modular rail 310 and/or the index rail 330. In yet another example, the optical sensor recognizes the edges of already installed PV modules. In yet another example, the optical sensor is used to recognize one or more fixed locations along the modular rail 310 and/or the index rail 330. In yet another example, the RFID sensor recognizes one or more fixed locations along the modular rail 310 and/or the index rail 330 and/or recognizes one or more selected PV modules. In yet another example, the magnetic sensor recognizes one or more magnetic wires that are embedded into or affixed to the modular rail 310 and/or the index rail 330.

In another example, the one or more devices 1660 are used at least for controlling. In one embodiment, the vehicle 1600 includes a computer system for coordinating one or more tasks that the vehicle 1600 performs. In another embodiment, the vehicle 1600 is in communication with a central or distributed computer system that coordinates one or more tasks of one or more vehicles 1600 that operate within the photovoltaic array 300.

In yet another example, the one or more devices 1660 is used at least for communicating. In one embodiment, the vehicle 1600 communicates with one or more other vehicles within the photovoltaic array 300 to jointly coordinate performance of the one or more tasks. In another embodiment, the vehicle 1600 includes a wireless communications interface (e.g., a WiFi interface, a Bluetooth interface, and/or an RFID interface). For example, the wireless communications interface allows the vehicle 1600 to communicate with the external world via a wireless transceiver that is coupled to the Internet.

According to some embodiments, the vehicle 1600 includes the one or more adhesive dispensing apparatuses 1670, which are, for example, used to dispense and/or apply one or more adhesive materials (e.g., during the process 2140). According to certain embodiments, the vehicle 1600 includes the one or more apparatuses 1680 that are used to prepare (e.g., cleaning) concrete surfaces (e.g., the one or more mounting surfaces 410 and/or 710) during, for example, the process 2140.

As discussed above and further emphasized here, FIG. 17 is merely an example, which should not unduly limit the scope of the claims. One of ordinary skill in the art would recognize many variations, alternatives, and modifications. In one embodiment, one or more components (e.g., the one or more adhesive dispensing apparatuses 1670) are removed from the vehicle 1600. In another embodiment, the vehicle 1600 is used as an installation vehicle, a supply vehicle, and/or a maintenance vehicle. For example, the vehicle 1600 (e.g., the vehicle 360) moves along both the one or more modular rails 310 and the one or more index rails 330.

Figure 18:
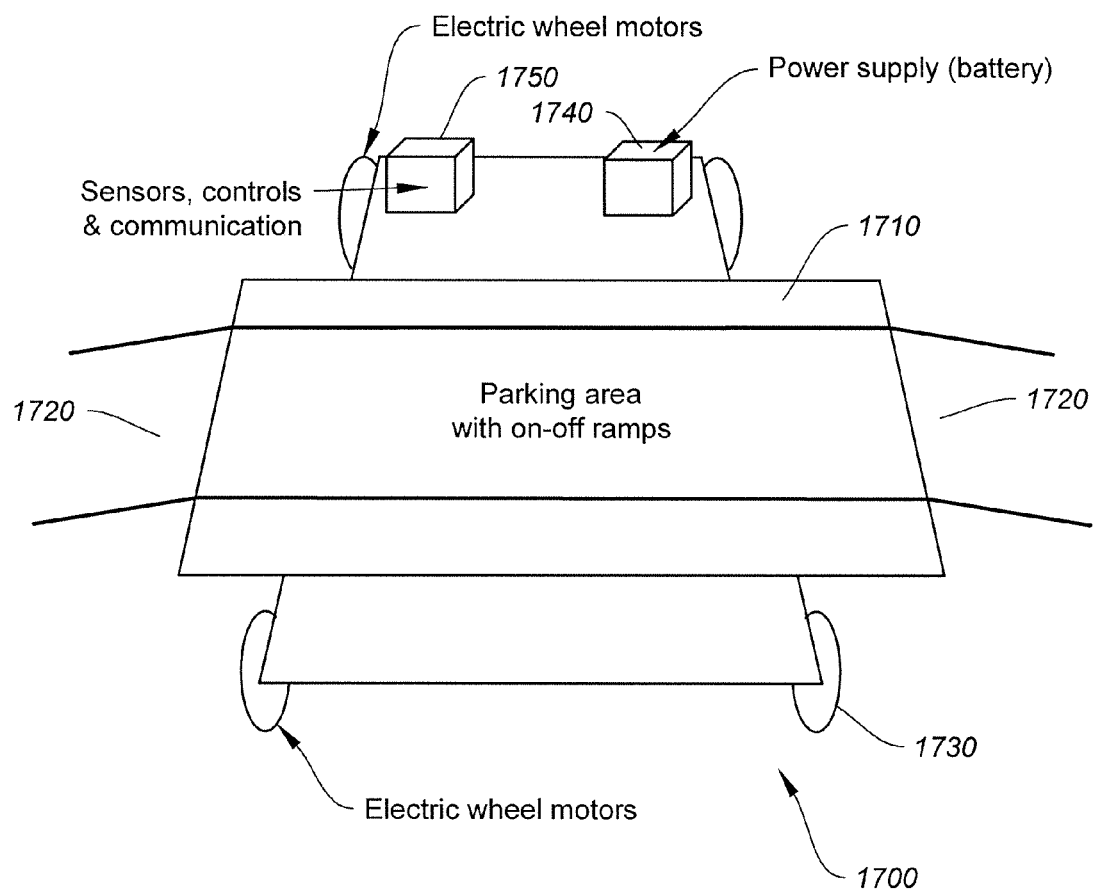
FIG. 18 is a simplified diagram of a vehicle for performing one or more tasks in the photovoltaic array according to another embodiment of the present invention.

FIG. 18 is a simplified diagram of a vehicle for performing one or more tasks in the photovoltaic array 300 according to another embodiment of the present invention. This diagram is merely an example, which should not unduly limit the scope of the claims. One of ordinary skill in the art would recognize many variations, alternatives, and modifications. A vehicle 1700 includes one or more wheels 1730, one or more power supplies 1740, one or more devices 1750 for sensing, controlling, and/or communicating, one or more parking areas 1710, and/or one or more ramps 1720.

For example, the one or more wheels 1730, the one or more power supplies 1740, and the one or more devices 1750 are the same as the one or more wheels 1610, the one or more power supplies 1620, and the one or more devices 1660, respectively. In another example, the vehicle 1700 can be operated along the one or more modular rails 310 and/or the one or more index rails 330. In yet another example, the vehicle 1700 is used as the vehicle 370 that carries one or more vehicles 360. In yet another example, the vehicle 1700 can perform one or more automated tasks and can have one or more features depending upon the particular embodiments (e.g., transporting construction material along the one or more index rails 330).

In one embodiment, the one or more parking areas 1710 and the one or more ramps 1720 serve to transport one or more vehicles (e.g., the vehicle 360 and/or the vehicle 1600) between different modular rails 310. For example, the vehicle 1700 is automated and pre-programmed to move to a selected modular rail 310 through a wireless communications interface (e.g., a WiFi interface, a Bluetooth interface, and/or an RFID interface). In another example, the vehicle 1700 can also communicate with the one or more other vehicles (e.g., the vehicle 360 and/or the vehicle 1600) so that the vehicle 1700 can send commands to and/or receive commands from the one or more other vehicles as to which modular rail 310 the vehicle 1700 should move to.

As shown in FIGS. 17 and 18, depending upon the embodiments, one or more vehicles can be used to automate one or more tasks for the installation and operation of the photovoltaic array 300. For example, a general-purpose vehicle (e.g., the vehicle 1600) can be used to perform all the tasks, without any assistance from the vehicle 1700. In another example, a specialized vehicle (e.g., the vehicle 1600 and/or the vehicle 1700) can be used to perform one or more specialized tasks.

In one embodiment, a vehicle (e.g., the vehicle 1600 and/or the vehicle 1700) is used to partially or fully automate one or more installation tasks of the photovoltaic array 300. For example, the vehicle can transport the one or more PV modules to one or more locations within the photovoltaic array 300 where the PV modules are to be installed. In another example, the vehicle can apply the one or more adhesive materials and/or the one or more flexible spacers, which are used to affix the one or more PV modules to the one or more mounting surfaces of the one or more modular rails 330 (e.g., the one or more mounting surfaces 410 and/or the one or more mounting surfaces 710). In yet another example, the vehicle can assemble and/or install the one or more interconnectors (e.g., the interconnector 1130, the interconnector 1230, the interconnector 1320, and/or the interconnector 1450) between the PV modules. In yet other examples, the vehicle can place and interconnect the one or more cables 340 throughout the photovoltaic array 300.

In another embodiment, a vehicle (e.g., the vehicle 1600 and/or the vehicle 1700) is used to partially or fully automate one or more operational tasks of the photovoltaic array 300, including without limitation one or more maintenance, diagnostics, material supply, and/or repair functions for the photovoltaic array 300. For example, the one or more maintenance functions include vegetation control, snow removal, cleaning, mounting integrity assessment, and/or mobile illumination (e.g., for assessing performance of one or more selected photovoltaic modules). In another example, the vehicle includes one or more robotic arms (e.g., the one or more robotic arms 1640) and/or one or more tools (e.g., the one or more tools 1650) to perform one or more tasks. In yet another example, the one or more tasks include cleaning of one or more PV modules to remove dirt and dust on the front glass, replacing one or more defective PV modules, and/or replacing one or more damaged or deteriorated interconnectors. In yet another example, the one or more tasks include communicating with one or more PV modules via a wireless communications interface (e.g., a WiFi interface, a Bluetooth interface, and/or an RFID interface) to determine the self-diagnostic status of the one or more PV modules, and/or lighting up individual panels of the PV modules at night and performing diagnostic tests as to their status and general health. In yet another example, the one or more tasks include asset tracking and/or removing ground vegetation that interferes with the PV modules (e.g., with a lawnmower-style accessory and/or with a chemical spray system).

According to some embodiments, the photovoltaic array 300 can bring benefits to certain conventional PV modules 210 that are not designed specifically for the photovoltaic array 300 if, for example, the junction boxes 220 on the conventional PV modules 210 do not interfere with the PV-module surfaces that are to be mounted onto one or more mounting surfaces, (e.g., the one or more mounting surfaces 410 and/or the mounting surface 710). In one embodiment, if the junction boxes 220 on the conventional PV modules 210 are accessible after the PV modules 210 are affixed to the one or more modular rails 310, automatic mounting and/or interconnection of the PV modules 210 by one or more vehicles (e.g., the one or more vehicles 1600 and/or the one or more vehicles 1700) can be performed. In another embodiment, placing of the one or more cables 340 in one or more plenums (e.g., the one or more plenums 420, the one or more plenums 620, and/or the one or more plenums 640) can be performed for the photovoltaic array 300 with certain conventional PV modules 210. In yet another embodiment, the periodic cleaning, vegetation control, and testing of certain conventional PV modules 210 can be performed by one or more vehicles (e.g., the one or more vehicles 1600 and/or the one or more vehicles 1700) for the photovoltaic array 300. In yet another embodiment, the testing and asset tracking of certain conventional PV modules 210 can be performed by one or more vehicles (e.g., the one or more vehicles 1600 and/or the one or more vehicles 1700), if, for example, one or more built-in smart RFID sensors are added to the conventional PV modules 210.

According to another embodiment, a rail system for a photovoltaic array includes at least one modular rail in a first direction. The modular rail includes a first vehicle support surface along the first direction and a first mounting surface along the first direction. The first vehicle support surface is configured to support at least a first vehicle moving in the first direction, and the first mounting surface is configured to support one or more photovoltaic modules mounted on the first mounting surface. For example, the system is implemented according to at least FIG. 3, FIG. 4, and/or FIG. 7.

In another example, the modular rail further includes a plenum along the first direction, the plenum being configured to hold one or more cables. In yet another example, the modular rail further includes a cover for the plenum. In yet another example, the modular rail further includes one or more notches at one or more intervals respectively along the modular rail, and the one or more notches are substantially perpendicular to the first direction. In yet another example, the modular rail further includes a base surface opposite to the first mounting surface, and the first mounting surface is tilted relative to the base surface. In yet another example, the modular rail further includes a base surface opposite to the first mounting surface. The base surface forms one or more channels at one or more intervals along the modular rail, and the one or more channels are substantially perpendicular to the first direction. In yet another example, the modular rail further includes a second mounting surface along the first direction, and the second mounting surface is substantially coplanar with the first mounting surface. In yet another example, the modular rail further includes one or more indicia at one or more intervals respectively along the modular rail, and the one or more indicia are configured to identify one or more locations in the rail system.

In yet another example, the rail system further includes a first photovoltaic module affixed to the first mounting surface with at least one or more mechanical connectors. In yet another example, the rail system further includes a first photovoltaic module affixed to the first mounting surface with at least one or more adhesive materials. In yet another example, the first photovoltaic module is affixed to the first mounting surface using at least a flexible spacer with at least the one or more adhesive materials. In yet another example, the rail system further includes a second photovoltaic module coupled to the first photovoltaic module through at least an interconnector. In yet another example, the interconnector is selected from a group consisting of a rigid in-line slide-on interconnector, a flexible slide-in interconnector, a flexible ribbon interconnector, and an in-line slide-in edge interconnector.

In yet another example, the rail system further includes the first vehicle configured to perform one or more first tasks. In yet another example, each of the one or more first tasks is associated with at least installation, operation, logistics, or servicing of a photovoltaic array. In yet another example, the first vehicle is further configured to perform the one or more first tasks automatically. In yet another example, the first vehicle includes at least a power supply selected from a group consisting of a battery, a photovoltaic module, and a combustion engine. In yet another example, the first vehicle includes at least a sensor configured to determine a location of the first vehicle. In yet another example, the modular rail includes one or more indicia at one or more intervals respectively along the modular rail, the one or more indicia are configured to identify one or more locations in the rail system, and the sensor is further configured to determine the location using the one or more indicia. In yet another example, the first vehicle includes at least a communication system to communicate with a second vehicle, the second vehicle being configured to perform one or more second tasks. In yet another example, the second vehicle is further configured to transport the first vehicle.

In yet another example, the rail system further includes at least one index rail in a second direction. The index rail includes a second vehicle support surface along the second direction, and the second vehicle support surface is configured to support at least a second vehicle moving in the second direction. In yet another example, the second vehicle support surface is further configured to support at least the first vehicle moving in the second direction. In yet another example, the index rail further includes a plenum along the second direction, the plenum being configured to hold one or more cables. In yet another example, the index rail further includes a cover for the plenum. In yet another example, the index rail further includes one or more notches at one or more intervals respectively along the index rail, and the one or more notches are substantially perpendicular to the second direction. In yet another example, the index rail further includes a base surface forming one or more channels at one or more intervals along the index rail, and the one or more channels being substantially perpendicular to the second direction. In yet another example, the first direction and the second direction are substantially perpendicular.

According to yet another embodiment, a method for making a photovoltaic rail includes grading an installation site, and extruding at least one photovoltaic rail associated with a substantially uniform profile along its length. The process for extruding at least one photovoltaic rail includes making at least a vehicle support surface along the photovoltaic rail. For example, the method is implemented according to at least FIG. 4, FIG. 7, and/or FIG. 9.

In another example, the method further includes placing a reinforcing mesh on the installation site before the process for extruding at least one photovoltaic rail is performed. In yet another example, the process for extruding at least one photovoltaic rail further includes making at least a mounting surface along the photovoltaic rail. In yet another example, the process for extruding at least one photovoltaic rail further includes making at least a plenum along the photovoltaic rail. In yet another example, the method further includes covering the plenum of the photovoltaic rail. In yet another example, the method further includes making one or more notches at one or more intervals respectively along the photovoltaic rail, and the one or more notches are substantially perpendicular to the modular rail. In yet another example, the photovoltaic rail is a modular rail or an index rail.

According to yet another embodiment, a method for installing a photovoltaic array includes forming at least one modular rail in a first direction. The modular rail includes a first vehicle support surface along the first direction and a mounting surface along the first direction. Additionally, the method includes affixing at least a first photovoltaic module and a second photovoltaic module to the mounting surface, and interconnecting the first photovoltaic module to the second photovoltaic module. The process for affixing at least a first photovoltaic module and a second photovoltaic module to the mounting surface includes moving a first vehicle along the first vehicle support surface, and the first vehicle includes at least one robotic arm. Additionally, the process for affixing at least a first photovoltaic module and a second photovoltaic module to the mounting surface includes affixing the first photovoltaic module and the second photovoltaic module to the mounting surface by at least the robotic arm. For example, the method is implemented according to at least FIG. 3, FIG. 5, FIG. 8, and/or FIG. 11. In another example, the method further includes forming at least one index rail in a second direction, and the index rail includes a second vehicle support surface along the index rail. In yet another example, the method further includes loading a first vehicle onto a second vehicle, and moving the second vehicle carrying the first vehicle. In yet another example, the process for affixing at least a first photovoltaic module and a second photovoltaic module to the mounting surface is performed with at least one or more adhesive materials. In yet another example, the process for affixing at least a first photovoltaic module and a second photovoltaic module to the mounting surface is performed with at least one or more mechanical connectors.

The present invention provides advantages over conventional technology. Certain embodiments of the present invention provide a photovoltaic array based on at least one or more modular rails that enable partial or full automation of many installation and operational tasks. Some embodiments of the present invention can reduce time and cost of installation and operation of a photovoltaic array. For example, the maintenance and operation cost of the photovoltaic array is significantly reduced. In another example, the servicing of the photovoltaic array (e.g., diagnostics, cleaning, and/or snow removal) is significantly improved. Certain embodiments of the present invention provide one or more vehicles that can move along one or more modular rails and/or one or more index rails to navigate throughout the photovoltaic array and perform various tasks. Some embodiments of the present invention provide a photovoltaic array that does not need panel-to-panel cable strain relief. Certain embodiments of the present invention provide an installation method and system that eliminates expensive junction boxes and standardized cable interconnects of conventional PV modules. Some embodiments of the present invention can improve wind tolerance of a photovoltaic array.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A method for making a photovoltaic module system, the method comprising:
   grading the ground at an installation site;
   at the installation site, extruding concrete onto the graded ground by a slip-form extrusion machine so as to form at least one rail on the graded ground for supporting one or more photovoltaic modules and associated with a substantially uniform profile along its length;
   wherein the process for extruding the concrete onto the graded ground by the slip-form extrusion machine so as to form the at least one rail includes making by the slip-form extrusion machine at least a first vehicle support surface, a second vehicle support surface along the at least one rail, a first photovoltaic module support surface, and a second photovoltaic module support surface,
   the first and second photovoltaic module support surfaces each being disposed between the first vehicle support surface and the second vehicle support surface;
   connecting a plurality of photovoltaic modules to the first photovoltaic module support surface and the second photovoltaic module support surface; and
   disposing a vehicle in contact with the first vehicle support surface and the second vehicle support surface, the vehicle comprising at least a first wheel, continuous track, or caterpillar tread and a second wheel, continuous track, or caterpillar tread,
   the first vehicle support surface receiving the first wheel, continuous track, or caterpillar tread of the vehicle, and
   the second vehicle support surface receiving the second wheel, continuous track, or caterpillar tread of the vehicle.

2. The method of claim 1, and further comprising placing a reinforcing mesh on the graded ground at the installation site before the process for extruding the at least one rail is performed;
   wherein the slip-form extrusion machine extrudes the concrete onto the graded ground through the reinforcing mesh.

3. The method of claim 1 wherein the process for extruding the concrete onto the graded ground by the slip-form extrusion machine so as to form the at least one rail further includes making by the slip-form extrusion machine at least a plenum along the at least one rail.

4. The method of claim 3, and further comprising covering the plenum of the at least one rail.

5. The method of claim 3, wherein the plenum comprises a groove in the rail and extending parallel to the rail.

6. The method of claim 1, and further comprising:
   making one or more notches at one or more intervals respectively along the at least one rail;
   wherein the one or more notches are substantially perpendicular to the at least one rail.

7. The method of claim 1 wherein the at least one rail includes at least one modular rail or at least one index rail.

8. The method of claim 1, further comprising filling an uneven surface of the graded ground with the concrete.

9. The method of claim 1, wherein the first photovoltaic module support surface has a different vertical height than does the first vehicle support surface.

10. The method of claim 1, further comprising:
    moving the vehicle on and along the first and second vehicle support surfaces.

11. The method of claim 1, wherein the vehicle is configured for photovoltaic module installation.

12. The method of claim 1, wherein the vehicle is configured for supply.

13. The method of claim 1, wherein the vehicle is configured for photovoltaic module maintenance.

* * * * *